(12) United States Patent
Shin et al.

(10) Patent No.: US 12,244,292 B2
(45) Date of Patent: Mar. 4, 2025

(54) BULK ACOUSTIC WAVE RESONATOR WITH STACKED PIEZOELECTRIC LAYERS

(71) Applicant: SKYWORKS GLOBAL PTE. LTD., Singapore (SG)

(72) Inventors: Kwang Jae Shin, Yongin (KR); Renfeng Jin, Irvine, CA (US); Benjamin Paul Abbott, Irvine, CA (US); Jong Duk Han, Yongin (KR); Myung Hyun Park, Seongnam-si (KR); Myeong Gweon Gu, Seoul (KR)

(73) Assignee: SKYWORKS GLOBAL PTE. LTD., Singapore (SG)

( * ) Notice: Subject to any disclaimer, the term of this patent is extended or adjusted under 35 U.S.C. 154(b) by 225 days.

(21) Appl. No.: 18/045,891

(22) Filed: Oct. 12, 2022

(65) Prior Publication Data
US 2023/0124493 A1   Apr. 20, 2023

Related U.S. Application Data

(60) Provisional application No. 63/256,065, filed on Oct. 15, 2021.

(51) Int. Cl.
| | |
|---|---|
| *H03H 9/17* | (2006.01) |
| *H03H 3/02* | (2006.01) |
| *H03H 9/02* | (2006.01) |
| *H03H 9/13* | (2006.01) |
| *H03H 9/56* | (2006.01) |

(52) U.S. Cl.
CPC ............ *H03H 9/17* (2013.01); *H03H 3/02* (2013.01); *H03H 9/02157* (2013.01); *H03H 9/133* (2013.01); *H03H 9/568* (2013.01); *H03H 2003/023* (2013.01)

(58) Field of Classification Search
CPC .... H03H 9/568; H03H 9/133; H03H 9/02157; H03H 3/02; H03H 9/17
USPC .................................... 333/186–191
See application file for complete search history.

(56) References Cited

U.S. PATENT DOCUMENTS

| | | | |
|---|---|---|---|
| 9,450,561 B2 * | 9/2016 | Choy | ............. H03H 9/02149 |
| 2014/0125203 A1 | 5/2014 | Choy et al. | |
| 2017/0025596 A1 * | 1/2017 | Qiu | ................. H01P 1/201 |

FOREIGN PATENT DOCUMENTS

| | | |
|---|---|---|
| EP | 3982537 A1 | 4/2022 |
| WO | 2020244332 A1 | 12/2020 |

OTHER PUBLICATIONS

Combined Search and Examination Report from corresponding United Kingdom Application No. 2215009.8 dated Mar. 27, 2023.

* cited by examiner

*Primary Examiner* — Rakesh B Patel
(74) *Attorney, Agent, or Firm* — Lando & Anastasi, LLP

(57) ABSTRACT

A bulk acoustic resonator comprises a membrane including a piezoelectric film having multiple layers of piezoelectric material. At least one of the multiple layers of piezoelectric material has a different dopant concentration than another of the multiple layers of piezoelectric material.

13 Claims, 24 Drawing Sheets

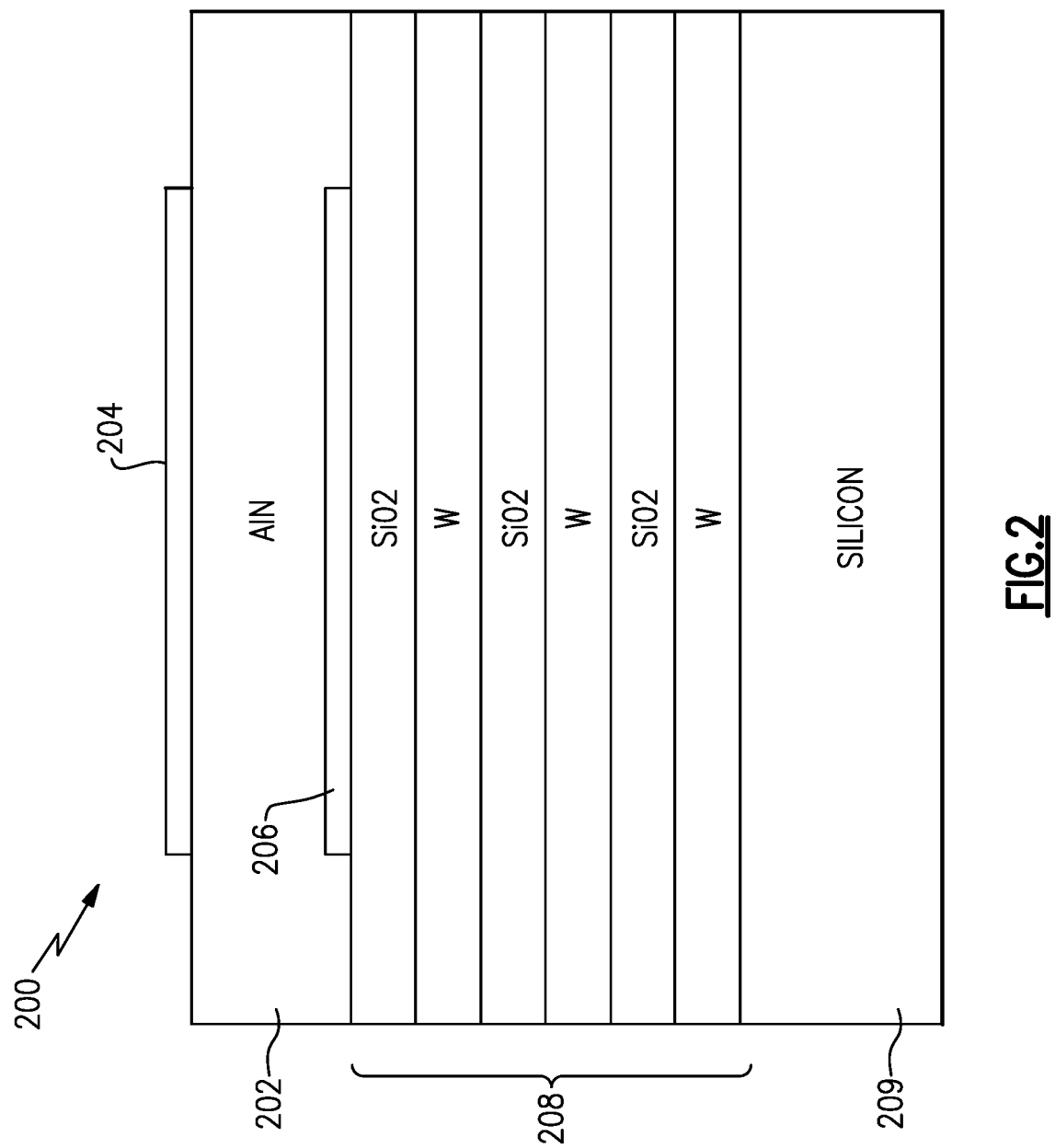

| wafer# | AlScN (nm) | | | |
|---|---|---|---|---|
| | Total THK | Sc18.8% Ratio | Sc 0% | Sc18.8% |
| A | 300 | 0% | 300 | x |
| B | | 25% | 225 | 75 |
| C | | 50% | 150 | 150 |
| D | | 75% | 75 | 225 |
| E | | 100% | 0 | 300 |
| F | 600 | 0% | 600 | x |
| G | | 25% | 450 | 150 |
| H | | 50% | 300 | 300 |
| J | | 75% | 150 | 450 |
| K | | 100% | x | 600 |
| L | 900 | 0% | 900 | x |
| M | | 25% | 675 | 225 |
| N | | 50% | 450 | 450 |
| P | | 75% | 225 | 675 |
| Q | | 100% | x | 900 |

FIG. 6A

| wafer# | Total THK | Sc18.8% Ratio | AlScN (nm) Sc 0% | AlScN (nm) Sc18.8% | AlScN (nm) Sc 0% |
|---|---|---|---|---|---|
| G | 600 | 25% | 450 | 150 | x |
| H |  | 50% | 300 | 300 | x |
| J |  | 75% | 150 | 450 | x |
| R | 600 | 25% | 225 | 150 | 225 |
| S |  | 50% | 150 | 300 | 150 |
| T |  | 75% | 75 | 450 | 75 |

FIG. 7A

BULK ACOUSTIC WAVE RESONATOR WITH STACKED PIEZOELECTRIC LAYERS

CROSS-REFERENCE TO RELATED APPLICATIONS

This application claims priority under 35 U.S.C. § 119(e) to U.S. Provisional Patent Application Ser. No. 63/256,065, titled "BULK ACOUSTIC WAVE RESONATOR WITH STACKED PIEZOELECTRIC LAYERS," filed Oct. 15, 2021, the entire contents of which is incorporated herein by reference for all purposes.

BACKGROUND

Technical Field

Embodiments of this disclosure relate to acoustic wave devices, specifically bulk acoustic wave resonators and electronic devices and modules including same.

Description of Related Technology

Acoustic wave devices, for example, bulk acoustic wave (BAW) devices may be utilized as components of filters in radio frequency electronic systems. For instance, filters in a radio frequency front end of a mobile phone can include acoustic wave filters. Two acoustic wave filters can be arranged as a duplexer.

SUMMARY

In accordance with one aspect, there is provided a bulk acoustic resonator comprising a membrane including a piezoelectric film having multiple layers of piezoelectric material. At least one of the multiple layers of piezoelectric material has a different dopant concentration than another of the multiple layers of piezoelectric material.

In some embodiments, the multiple layers of piezoelectric material are arranged asymmetrically with respect to thickness wherein an upper layer of the multiple layers of piezoelectric material has a different thickness than a lower layer of the multiple layers of piezoelectric material.

In some embodiments, the piezoelectric film includes two layers of piezoelectric material, a first of the two layers of piezoelectric material being closer to an input side of the piezoelectric film and having a higher doping level than a second of the two layers of piezoelectric material.

In some embodiments, wherein the first layer of piezoelectric material is formed of aluminum nitride (AlN) doped with scandium (Sc) and the second layer of piezoelectric material is formed of undoped AlN.

In some embodiments, the first layer of piezoelectric material has a substantially same thickness as a thickness of the second layer of piezoelectric material.

In some embodiments, the piezoelectric film includes more than two layers of piezoelectric material, a first of the more than two layers of piezoelectric material being closer to an input side of the piezoelectric film and having a higher doping level than others of the more than two layers of piezoelectric material.

In some embodiments, wherein the first of the more than two layers of piezoelectric material is formed of AlN doped with Sc and others of the more than two layers of piezoelectric material are formed of undoped AlN.

In some embodiments, the more than two layers of piezoelectric material are arranged symmetrically with respect to doping concentration and thickness in a direction from the input side to an output side of the piezoelectric film.

In some embodiments, the more than two layers of piezoelectric material are arranged asymmetrically with respect one of doping concentration or thickness in a direction from the input side to an output side of the piezoelectric film.

In some embodiments, the piezoelectric film includes an odd number of more than two layers of piezoelectric material, a centermost of the more than two layers of piezoelectric material having a higher doping level than others of the more than two layers of piezoelectric material.

In some embodiments, the centermost of the more than two layers of piezoelectric material has a greater thickness than the others of the more than two layers of piezoelectric material.

In some embodiments, the more than two layers of piezoelectric material are configured symmetrically with respect to doping concentration and thickness in a direction from the input side to an output side of the piezoelectric film.

In some embodiments, the centermost of the more than two layers of piezoelectric material has a thickness approximately equal to a sum of the thicknesses of the others of the more than two layers of piezoelectric material.

In some embodiments, the centermost of the more than two layers of piezoelectric material is formed of AlN doped with Sc and the others of the more than two layers of piezoelectric material are formed of undoped AlN.

In some embodiments, the bulk acoustic wave resonator is configured as a film bulk acoustic wave resonator.

In some embodiments, the bulk acoustic wave resonator is configured as solidly mounted resonator.

In some embodiments, the bulk acoustic wave resonator is included in a radio frequency filter.

In some embodiments, the bulk acoustic wave resonator is included in an electronic device module.

In some embodiments, the bulk acoustic wave resonator is included in an electronic device.

In accordance with another aspect, there is provided a method of forming a bulk acoustic wave resonator. The method comprises forming a membrane for the bulk acoustic wave resonator by forming a first piezoelectric film having a first doping concentration on a second piezoelectric material film having a second doping concentration different from the first doping concentration.

BRIEF DESCRIPTION OF THE DRAWINGS

Embodiments of this disclosure will now be described, by way of non-limiting example, with reference to the accompanying drawings.

FIG. 2 is a simplified cross-sectional diagram of an example of a solidly mounted resonator;

FIG. 6A is a table of the thicknesses and layer arrangements and compositions of dual layer piezoelectric material films of FBARs simulated to determine the effect of the arrangement and composition of the layers of the piezoelectric material film on the H2 and H3 harmonic signals generated in the FBAR;

FIG. 7A is a table of the thicknesses and layer arrangements and compositions of dual and triple layer piezoelectric material films of FBARs simulated to determine the effect of the arrangement and composition of the layers of the piezoelectric material film on the H2 and H3 harmonic signals generated in the FBAR;

DETAILED DESCRIPTION OF CERTAIN EMBODIMENTS

Figure 1:
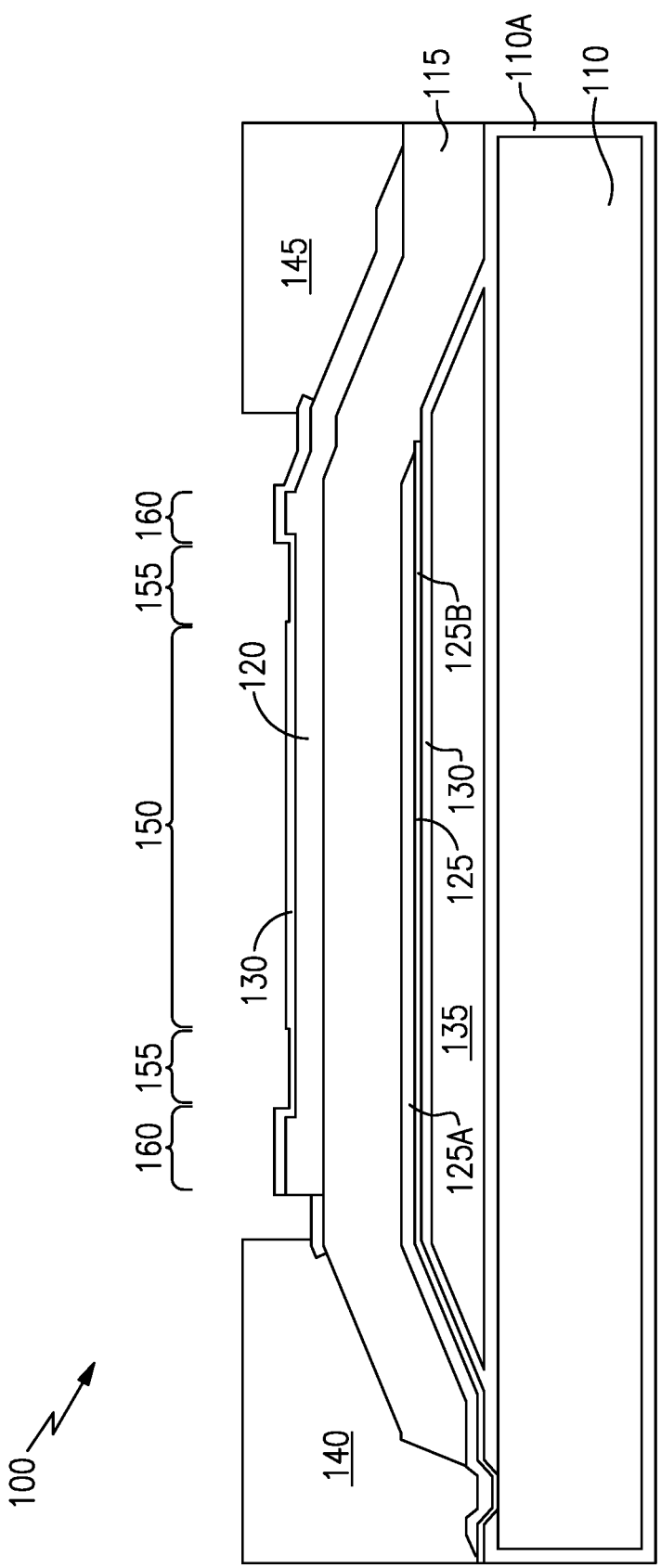
FIG. 1 is a simplified cross-sectional diagram of an example of film bulk acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale and that some intermediate materials or layers are not illustrated. Moreover, it will be understood that certain embodiments can include more elements than illustrated in a drawing and/or a subset of the elements illustrated in a drawing. Further, some embodiments can incorporate any suitable combination of features from two or more drawings.

Film bulk acoustic wave resonators (FBARs) are a form of bulk acoustic wave (BAW) resonator that generally includes a film of piezoelectric material sandwiched between a top and a bottom electrode and suspended over a cavity that allows for the film of piezoelectric material to vibrate. A signal applied across the top and bottom electrodes causes an acoustic wave to be generated in and travel through the film of piezoelectric material. A FBAR exhibits a frequency response to applied signals with a resonance peak determined by a thickness of the film of piezoelectric material. Ideally, the only acoustic wave that would be generated in a FBAR is a main acoustic wave that would travel through the film of piezoelectric material in a direction perpendicular to layers of conducting material forming the top and bottom electrodes, sometimes referred to as "piston mode" operation. The piezoelectric material of a FBAR, however, typically has a non-zero Poisson's ratio. Compression and relaxation of the piezoelectric material associated with passage of the main acoustic wave may thus cause compression and relaxation of the piezoelectric material in a direction perpendicular to the direction of propagation of the main acoustic wave. The compression and relaxation of the piezoelectric material in the direction perpendicular to the direction of propagation of the main acoustic wave may generate transverse acoustic waves that travel perpendicular to the main acoustic wave (parallel to the surfaces of the electrode films) through the piezoelectric material. The transverse acoustic waves may be reflected back into an area in which the main acoustic wave propagates and may induce spurious acoustic waves travelling in the same direction as the main acoustic wave. These spurious acoustic waves may degrade the frequency response of the FBAR from what is expected or from what is intended and are generally considered undesirable.

FIG. 1 is cross-sectional view of an example of a FBAR, indicated generally at 100, having what may be referred to as a mesa structure. The FBAR 100 is disposed on a substrate 110, for example, a silicon substrate that may include a dielectric surface layer 110A of, for example, silicon dioxide. The FBAR 100 includes a layer or film of piezoelectric material 115, for example, aluminum nitride (AlN). A top electrode 120 is disposed on top of a portion of the layer or film of piezoelectric material 115 and a bottom electrode 125 is disposed on the bottom of a portion of the layer or film of piezoelectric material 115. The top electrode 120 may be formed of, for example, ruthenium (Ru), molybdenum (Mo), or a Ru/Mo alloy. The bottom electrode 125 may include a layer 125A of Ru (or Mo or Ru/Mo alloy) disposed in contact with the bottom of the portion of the layer or film of piezoelectric material 115 and a layer 125B of titanium (Ti) disposed on a lower side of the layer 125A of Ru opposite a side of the layer 125A of Ru in contact with the bottom of the portion of the layer or film of piezoelectric material 115. Each of the top electrode 120 and the bottom electrode 125 may be covered with a layer of dielectric material 130, for example, silicon dioxide. A cavity 135 is defined beneath the layer of dielectric material 130 covering the bottom electrode 125 and the surface layer 110A of the substrate 110. A bottom electrical contact 140 formed of, for example, copper may make electrical connection with the bottom electrode 125 and a top electrical contact 145 formed of, for example, copper may make electrical connection with the top electrode 120.

The FBAR 100 may include a central region 150 including a main active domain in the layer or film of piezoelectric material 115 in which a main acoustic wave is excited during operation. The central region 150 may also be referred to as the active area of the FBAR 100. The central region may have a width of, for example, between about 20 μm and about 100 μm. A recessed frame region or regions 155 may bound and define the lateral extent of the central region 150. The recessed frame regions may have a width of, for example, about 1 μm. The recessed frame region(s) 155 may be defined by areas that have a thinner layer of dielectric material 130 on top of the top electrode 120 than in the central region 150. The dielectric material layer 130 in the recessed frame region(s) 155 may be from about 10 nm to about 100 nm thinner than the dielectric material layer 130 in the central region 150. The difference in thickness of the dielectric material in the recessed frame region(s) 155 vs. in the central region 150 may cause the resonant frequency of the device in the recessed frame region(s) 155 to be between about 5 MHz to about 50 MHz higher than the resonant frequency of the device in the central region 150. In some embodiments, the thickness of the dielectric material layer 130 in the central region 150 may be about 200 nm to about 300 nm and the thickness of the dielectric material layer 130 in the recessed frame region(s) 155 may be about 100 nm. The dielectric film 300 in the recessed frame region(s) 155 is typically etched during manufacturing to achieve a desired difference in acoustic velocity between the central region 150 and the recessed frame region(s) 155. Accordingly, the dielectric film 300 initially deposited in both the central region 150 and recessed frame region(s) 155 is deposited with a sufficient thickness that allows for etching of sufficient dielectric film 300 in the recessed frame region(s) 155 to achieve a desired difference in thickness of the dielectric film 300 in the central region 150 and recessed frame region(s) 155 to achieve a desired acoustic velocity difference between these regions.

A raised frame region or regions 160 may be defined on an opposite side of the recessed frame region(s) 155 from the central region 150 and may directly abut the outside edge(s) of the recessed frame region(s) 155. The raised frame regions may have widths of, for example, about 1 μm. The raised frame region(s) 160 may be defined by areas where the top electrode 120 is thicker than in the central region 150 and in the recessed frame region(s) 155. The top electrode 120 may have the same thickness in the central region 150 and in the recessed frame region(s) 155 but a greater thickness in the raised frame region(s) 160. The top electrode 120 may be between about 50 nm and about 500 nm thicker in the raised frame region(s) 160 than in the central region 150 and/or in the recessed frame region(s) 155. In some embodiments the thickness of the top electrode in the central region may be between 50 and 500 nm. In other embodiments, the top electrode 120 may have the same thickness in the central region 150, the recessed frame region(s) 155, and the raised frame region(s) 160, and the raised frame may be defined by a thicker layer of dielectric film 300 in the raised frame regions than in the central region 150 and recessed frame region(s) 155.

The recessed frame region(s) 155 and the raised frame region(s) 160 may contribute to dissipation or scattering of transverse acoustic waves generated in the FBAR 100 during operation and/or may reflect transverse waves propagating outside of the recessed frame region(s) 155 and the raised frame region(s) 160 and prevent these transverse acoustic waves from entering the central region and inducing spurious signals in the main active domain region of the FBAR. Without being bound to a particular theory, it is believed that due to the thinner layer of dielectric material 130 on top of the top electrode 120 in the recessed frame region(s) 155, the recessed frame region(s) 155 may exhibit a higher velocity of propagation of acoustic waves than the central region 150. Conversely, due to the increased thickness and mass of the top electrode 120 in the raised frame region(s) 160, the raised frame regions(s) 160 may exhibit a lower velocity of propagation of acoustic waves than the central region 150 and a lower velocity of propagation of acoustic waves than the recessed frame region(s) 155. The discontinuity in acoustic wave velocity between the recessed frame region(s) 155 and the raised frame region(s) 160 creates a barrier that scatters, suppresses, and/or reflects transverse acoustic waves.

Another form of BAW is a solidly mounted resonator (SMR). FIG. 2 is a simplified cross-sectional view of an SMR 200. As illustrated, the SMR 200 includes a piezoelectric material layer 202, an upper electrode 204 disposed on top of the piezoelectric material layer 202, and a lower electrode 206 disposed on a lower surface of the piezoelectric material layer 202. The piezoelectric material layer 202 can be an aluminum nitride layer. In other instances, the piezoelectric material layer 202 can be any other suitable piezoelectric material layer. The lower electrode 206 can be grounded in certain instances. In some other instances, the lower electrode 206 can be floating. Bragg reflectors 208 are disposed between the lower electrode 206 and a semiconductor substrate 209. Any suitable Bragg reflectors can be implemented. For example, the Bragg reflectors can be $SiO_2$/W.

It would be desirable for BAW resonators to produce only a single main acoustic wave. In actual devices, however, spurious signals are often produced in addition to the intended main acoustic wave. These spurious signals may degrade the performance of the BAW resonators, for example, by adding discontinuities into admittance curves of the BAW resonators, decreasing the quality actor of the BAW resonators, or decreasing the acoustic coupling factor of the BAW resonators. One type of spurious signal of concern that may be undesirably generated in a BAW resonator during operation is a harmonic, a signal that occurs at a multiple of a frequency of a desired signal. Harmonic signals may include second harmonics (H2) that occur at twice the frequency of a desired signal, third harmonics (H3) that occur at three times the frequency of a desired signal, etc. Such harmonic spurious signals generated in BAW filters will degrade the receive sensitivity of mobile handsets including the BAW filters. Aspects and embodiments disclosed herein may reduce the amplitude of spurious harmonic signals in BAW resonators such as FBARs or SMRs.

In accordance with some aspects, the piezoelectric material film in a BAW resonator may be formed of a stack of multiple layers, at least two of which have different compositions and/or thicknesses. At least one of the piezoelectric layers in a piezoelectric material layer stack of a BAW resonator may be AlN doped with an impurity, for example, scandium (Sc), or doped with the impurity at a concentration different than at least one other of the piezoelectric layers in the piezoelectric material layer stack. The examples presented herein will be described with reference to AlN layers doped with Sc or undoped, but other impurities may also fall within the scope of this disclosure, for example, any one or more of Y, Ca, Nb, Mg, Ti, Zr, Hf, or other rare earth metals. Doped piezoelectric materials such as disclosed in U.S. Pat. No. 11,031,540, "SUBSTITUTED ALUMINUM NITRIDE FOR IMPROVED ACOUSTIC WAVE FILTERS," incorporated herein by reference, may be utilized in one or more layers of a piezoelectric material layer stack for a BAW resonator.

In various embodiments in which a piezoelectric material layer stack of a BAW resonator includes one or more Sc-doped AlN layers and one or more undoped AlN layers, the degree to which harmonic signals are suppressed by the presence of the one or more Sc-doped AlN layers may be impacted by the position of the Sc-doped AlN layer(s) in the piezoelectric material layer stack.

Figure 3A:
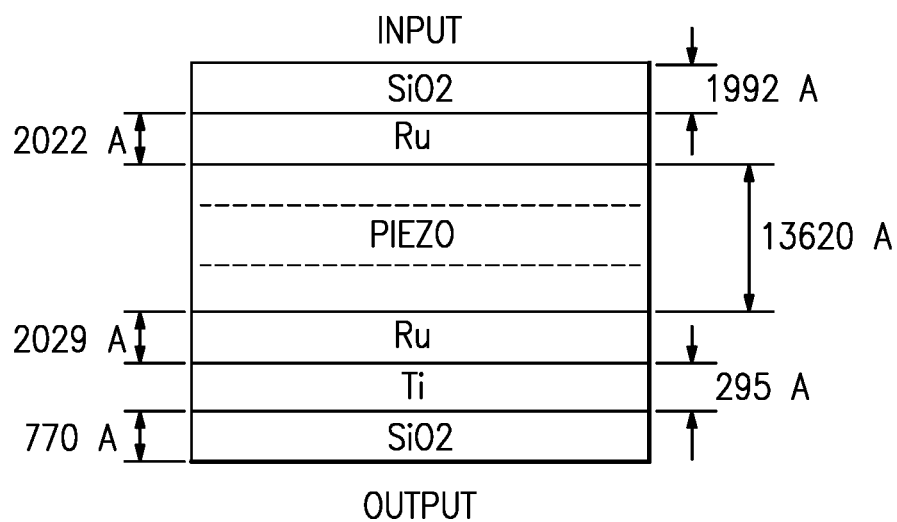
FIG. 3A illustrates the layers of a membrane of a simulated film bulk acoustic resonator (FBAR) used to evaluate the effect on generation of spurious harmonic signals of arrangement of differently doped layers in a dual layer piezoelectric material film.

A simulation was performed for a FBAR resonator having a membrane including the electrode, dielectric, and piezoelectric material films with thicknesses indicated in FIG. 3A. The "input" side of the membrane corresponds to the top of the electrode/piezoelectric material membranes in the FBAR of FIG. 1 or the SMR of FIG. 2. The piezoelectric material film was modeled as being a three-layer structure in which either the top, middle, or bottom layer was Sc-doped AlN and the other two layers were undoped AlN. The results on the suppression of H2 and H3 harmonics of these three different examples were compared against one another and against a FBAR with a piezoelectric film formed wholly of Sc-doped AlN.

Figure 3B:
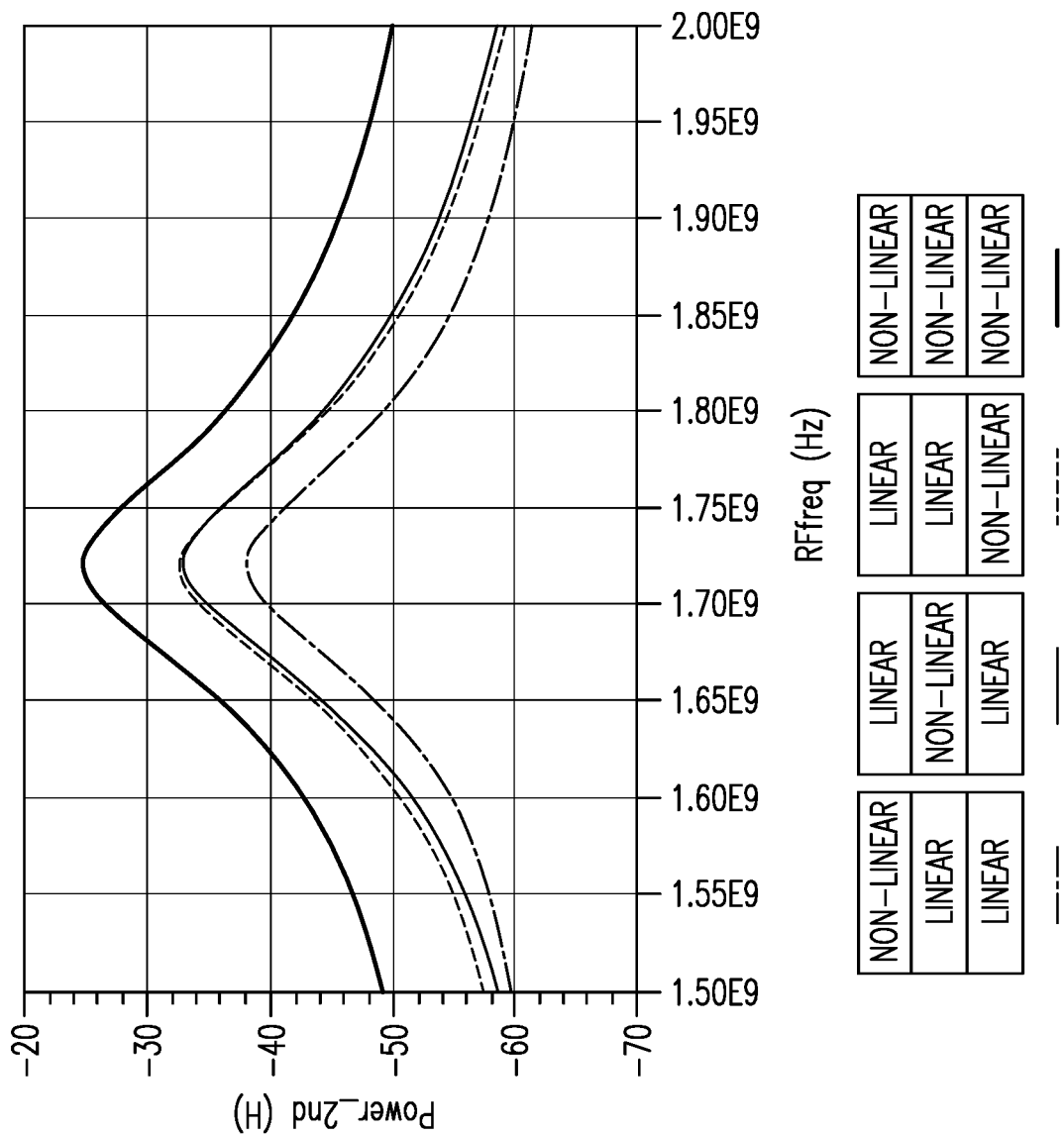
FIG. 3B illustrates the results of simulations of the H2 harmonic of the FBAR having the membrane structure of FIG. 3A with different arrangements of differently doped layers in the piezoelectric material film.
Figure 3C:
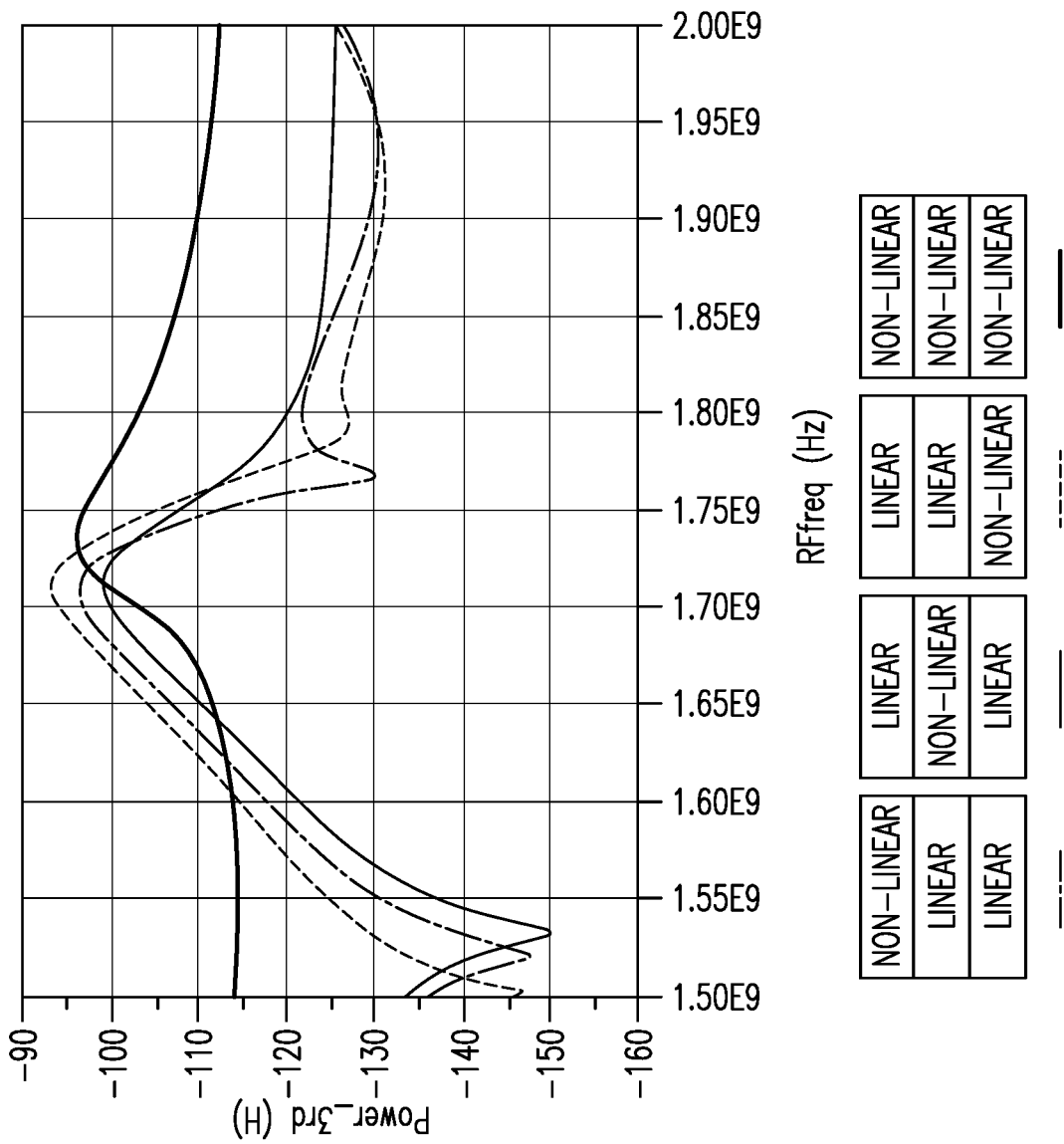
FIG. 3C illustrates the results of simulations of the H3 harmonic of the FBAR having the membrane structure of FIG. 3A with different arrangements of differently doped layers in the piezoelectric material film.

The results of the simulation of H2 are illustrated in the chart of FIG. 3B and the results of the simulation of H3 are illustrated in the chart of FIG. 3C. In the legends of FIGS. 3B and 3C, the position of the Sc-doped AlN layers are indicated and labelled as the "Non-Linear" layers. The layers labelled "Linear" are undoped AlN. The uppermost layer is on the input side of the simulated resonator membrane. In FIGS. 3B and 3C, as well as the other charts included herein, the frequency indicated on the x-axis are the input frequencies—the harmonics curves occur at twice (FIG. 3B) or three times (FIG. 3C) the input frequencies.

From FIG. 3B it can be seen that placing the non-linear (doped) layer on the input side of the piezoelectric material layer stack suppresses H2 to a greater degree than the other arrangements simulated. Without wishing to be bound to a particular theory, it is believed that this occurs because the H2 harmonics are partially rejected by the undoped piezoelectric layer following the doped layer. Forming the piezoelectric material film out of three layers of non-linear (doped) material gave the worst H2 performance of the options simulated. Relative to the layer on the top, nonlinear layers in the center or bottom have less H2 impact.

From FIG. 3C it can be seen that placing the non-linear (doped) layer on the input side of the piezoelectric material layer stack also suppresses H3 to a greater degree than the other arrangements simulated. Forming the piezoelectric material film out of three layers of non-linear (doped) material gave the worst H3 performance of the options simulated, although the stack with the non-linear layer being last (furthest from the input) also gave poor H3 performance with an input frequency close to the resonance frequency of the resonator.

Figure 4A:
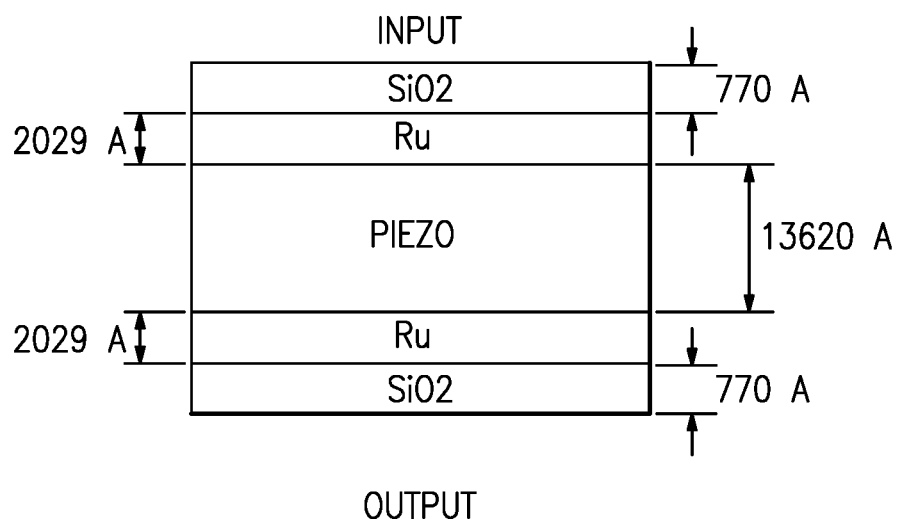
FIG. 4A illustrates the layers of a membrane of a simulated FBAR used to evaluate the effect on generation of spurious harmonic signals of arrangement of differently doped layers in a four layer piezoelectric material film.

Simulations were performed for a FBAR having a dielectric, electrode, and piezoelectric material membrane with the dimensions indicated in FIG. 4A and the piezoelectric material film being formed by four layers. Four conditions were simulated—one for the non-linear layer being in each of the four positions in the piezoelectric material stack. The results of these simulations are shown in FIGS. 4B (H2) and 4C (H3).

Figure 4B:
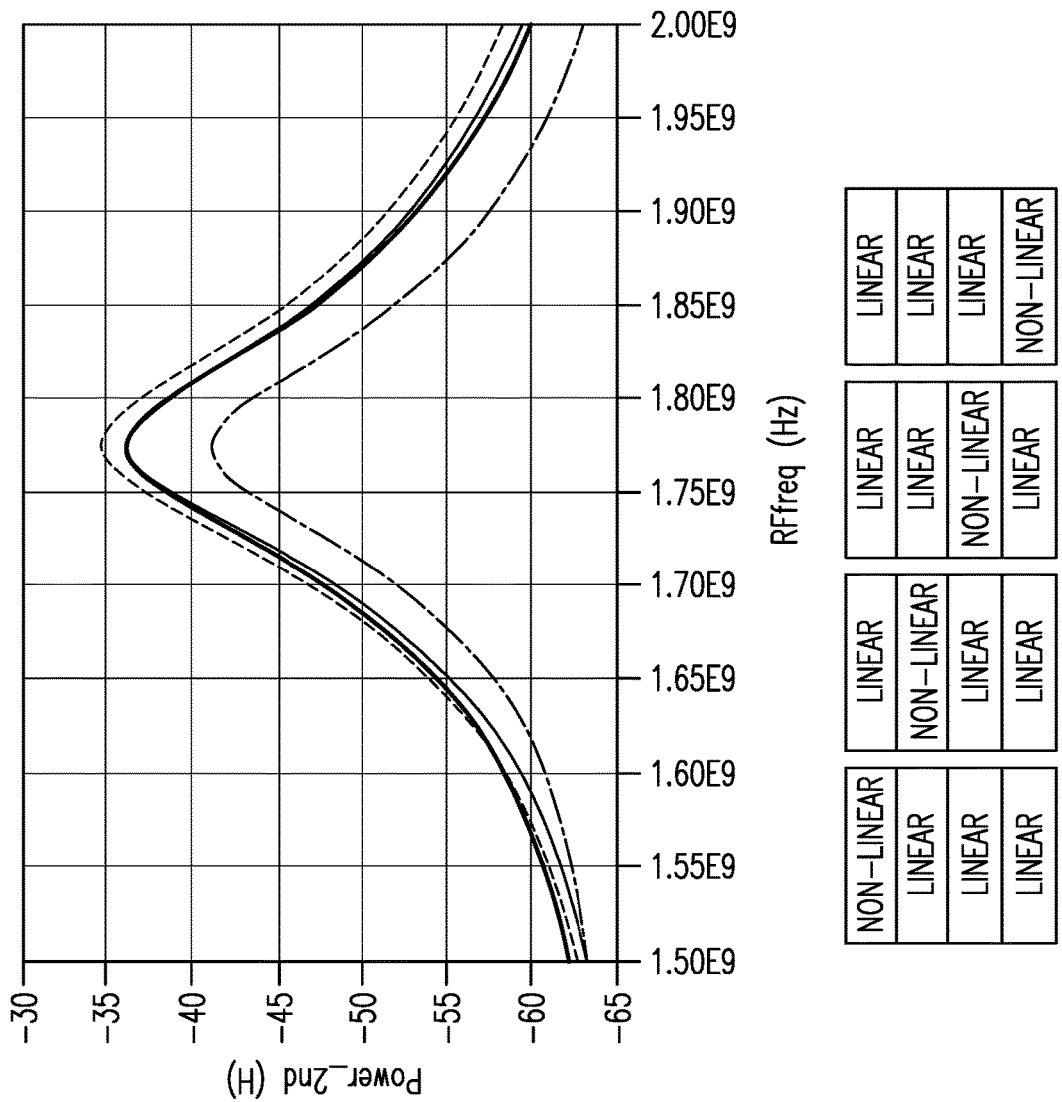
FIG. 4B illustrates the results of simulations of the H2 harmonic of the FBAR having the membrane structure of FIG. 4A with different arrangements of differently doped layers in the piezoelectric material film.

From FIG. 4B it can be seen that placing the non-linear (doped) layer on the input side of the piezoelectric material layer stack again suppresses H2 to a greater degree than the other arrangements simulated. Without wishing to be bound to a particular theory, it is believed that this occurs because the H2 harmonics are partially rejected by the undoped piezoelectric layer following the doped layer.

Figure 4C:
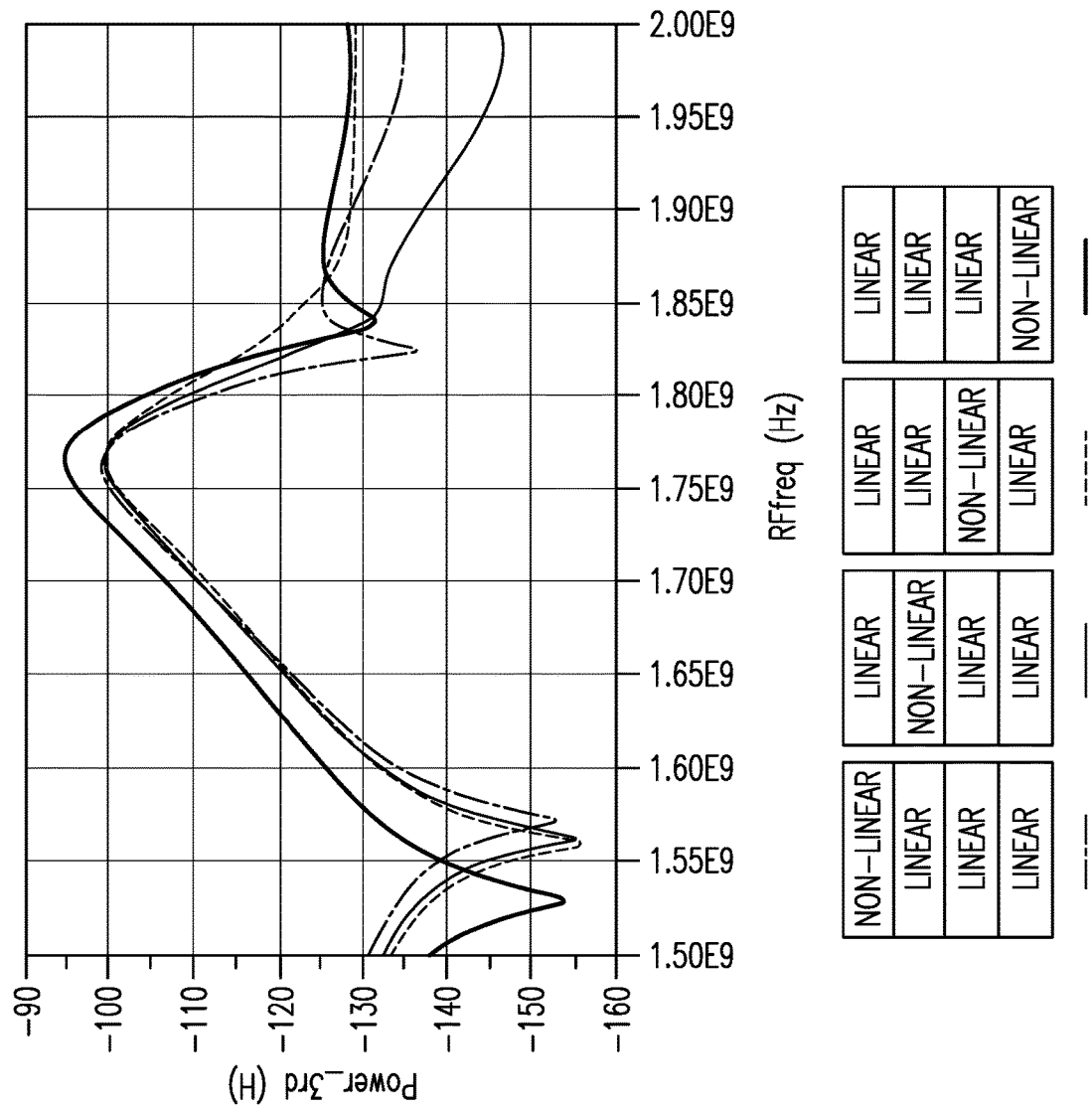
FIG. 4C illustrates the results of simulations of the H3 harmonic of the FBAR having the membrane structure of FIG. 4A with different arrangements of differently doped layers in the piezoelectric material film.

From FIG. 4C it can be seen that placing the non-linear (doped) layer on the input side of the piezoelectric material layer stack also suppresses H3 to a greater degree than the other arrangements simulated. Forming the piezoelectric material film with the non-linear layer on the output side of the piezoelectric material layer stack gave the worst H3 performance.

Figure 5A:
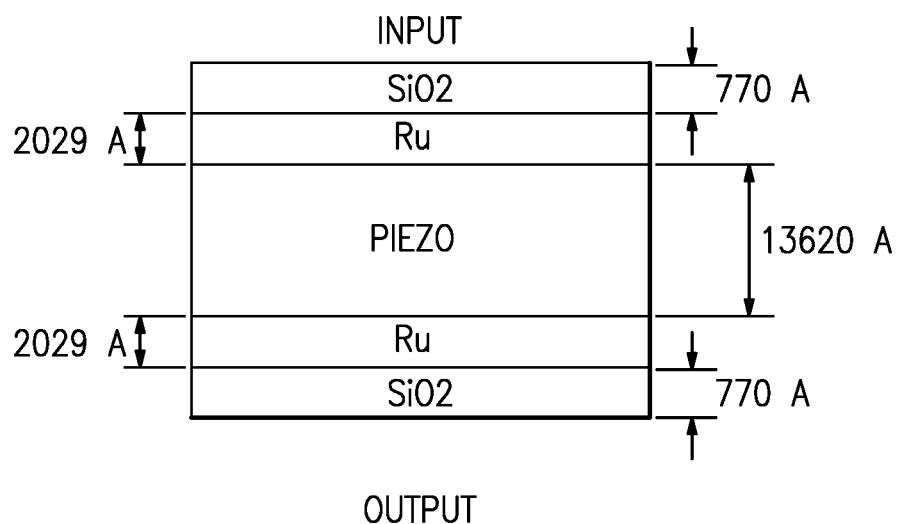
FIG. 5A illustrates the layers of a membrane of a simulated FBAR used to evaluate the effect on generation of spurious harmonic signals of arrangement of differently doped layers in a piezoelectric material film having an odd number of layers.
Figure 5B:
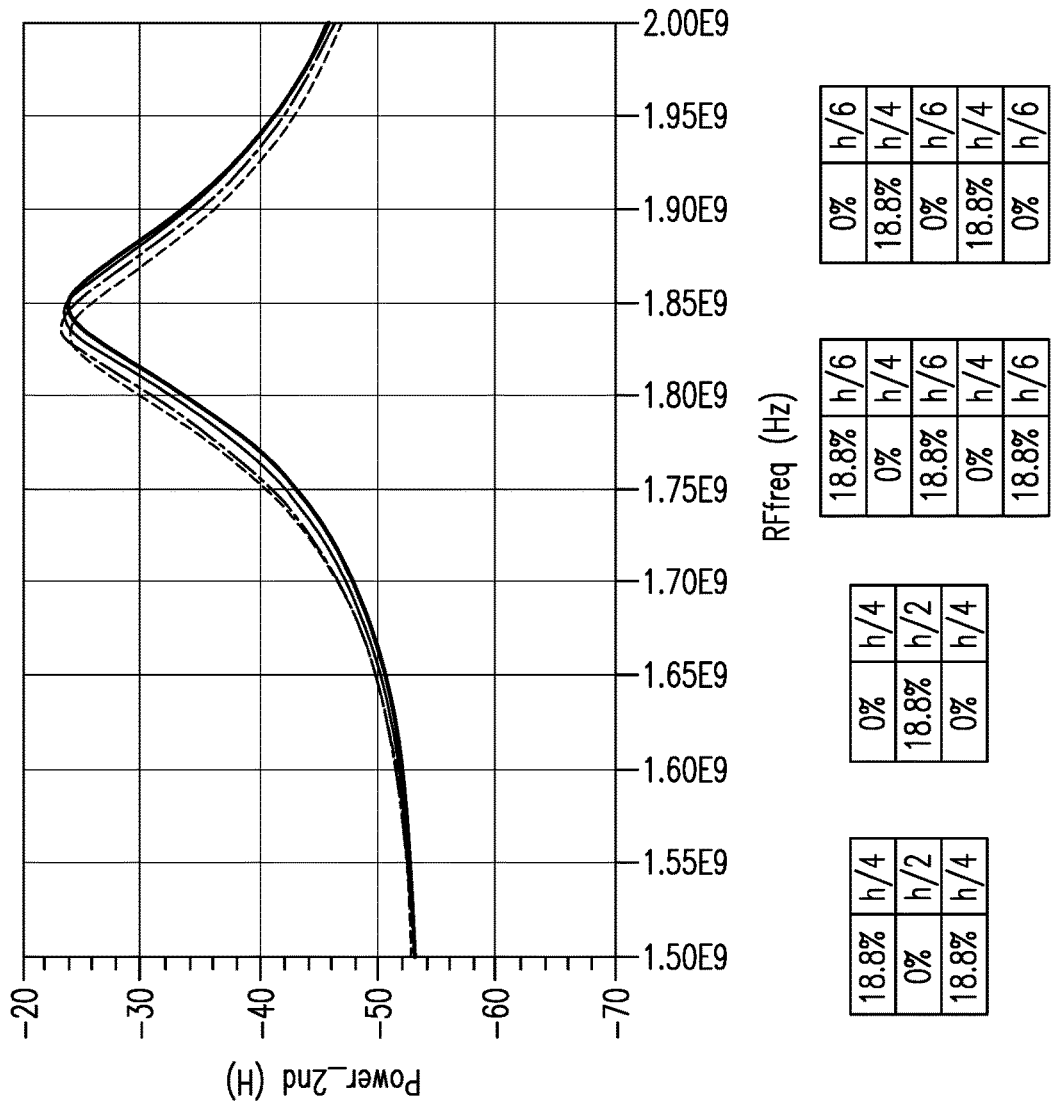
FIG. 5B illustrates the results of simulations of the H2 harmonic of the FBAR having the membrane structure of FIG. 5A with different arrangements of differently doped layers in the piezoelectric material film.
Figure 5C:
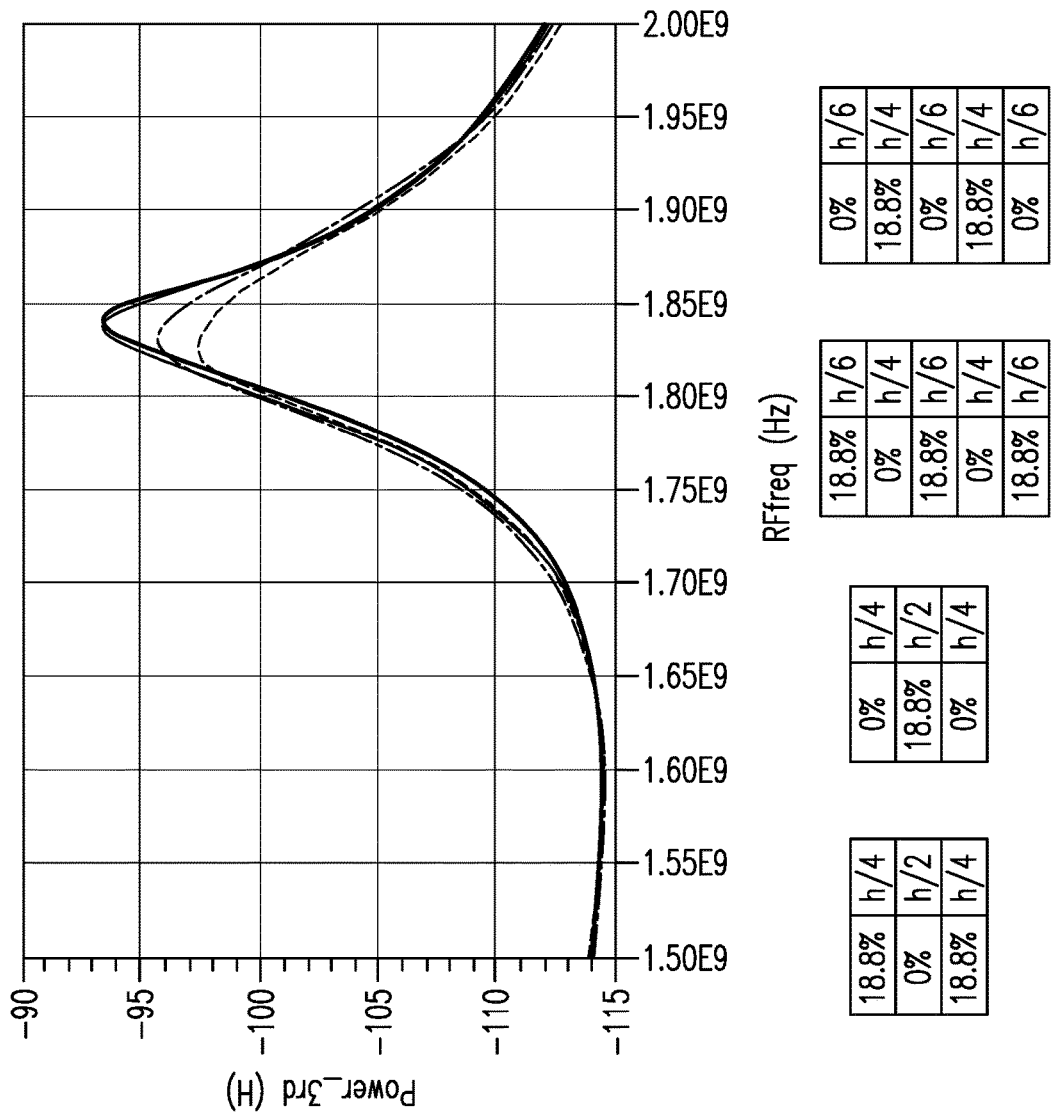
FIG. 5C illustrates the results of simulations of the H3 harmonic of the FBAR having the membrane structure of FIG. 5A with different arrangements of differently doped layers in the piezoelectric material film.

Simulations were performed for a FBAR having a dielectric, electrode, and piezoelectric material membrane with the dimensions indicated in FIG. 5A and the piezoelectric material film being formed by an odd number of layers, either three or five layers and a total thickness of 13,620 Å. The non-linear layers were modeled as being doped with 18.8 at % Sc. The height of each layer was either half the total piezoelectric layer stack height (h/2), one quarter the total piezoelectric layer stack height (h/4), or one sixth the total piezoelectric layer stack height (h/6). The results of these simulations are shown in FIGS. 5B (for H2) and 5C (for H3) with the different locations and thicknesses of the different piezoelectric material layers indicated in the legends, and with the different layers being labeled with their Sc doping. Among the simulated configurations, the configuration with three piezoelectric material layers and with the Sc-doped layer in the center of the stack gave slightly better H2 suppression and noticeably better H3 suppression than the other configurations.

Simulations were performed to examine the effect on H2 and H3 suppression of the relative thickness of the Sc-doped AlN layer and undoped AlN layer in a dual layer piezoelectric film stack in an FBAR. Three different piezoelectric film stack thicknesses from different wafers were simulated—a 300 µm thick stack, a 600 µm thick stack, and a 900 µm thick stack. The Sc-doped AlN layer was either 0% (no Sc-doped AlN layer), 25%, 50%, 75%, or 100% (no undoped AlN layer) of the total piezoelectric film stack thickness. A list of the simulated samples and the relative thickness of the doped and undoped AlN layers are shown in the table of FIG. 6A, with the wafer number identifying each sample. In each sample including a doped AlN layer, the layer doped with 18.8 at % Sc was the upper layer (the layer on the input side) in the dual layer stack. Simulations were performed for FBARs with active membrane areas of 10 µm² (labelled "10K" on the result charts), 5 µm² (labelled "5K" on the result charts), and 2 µm² (labelled "2K" on the result charts). Each simulation we performed twice.

Figure 6B:
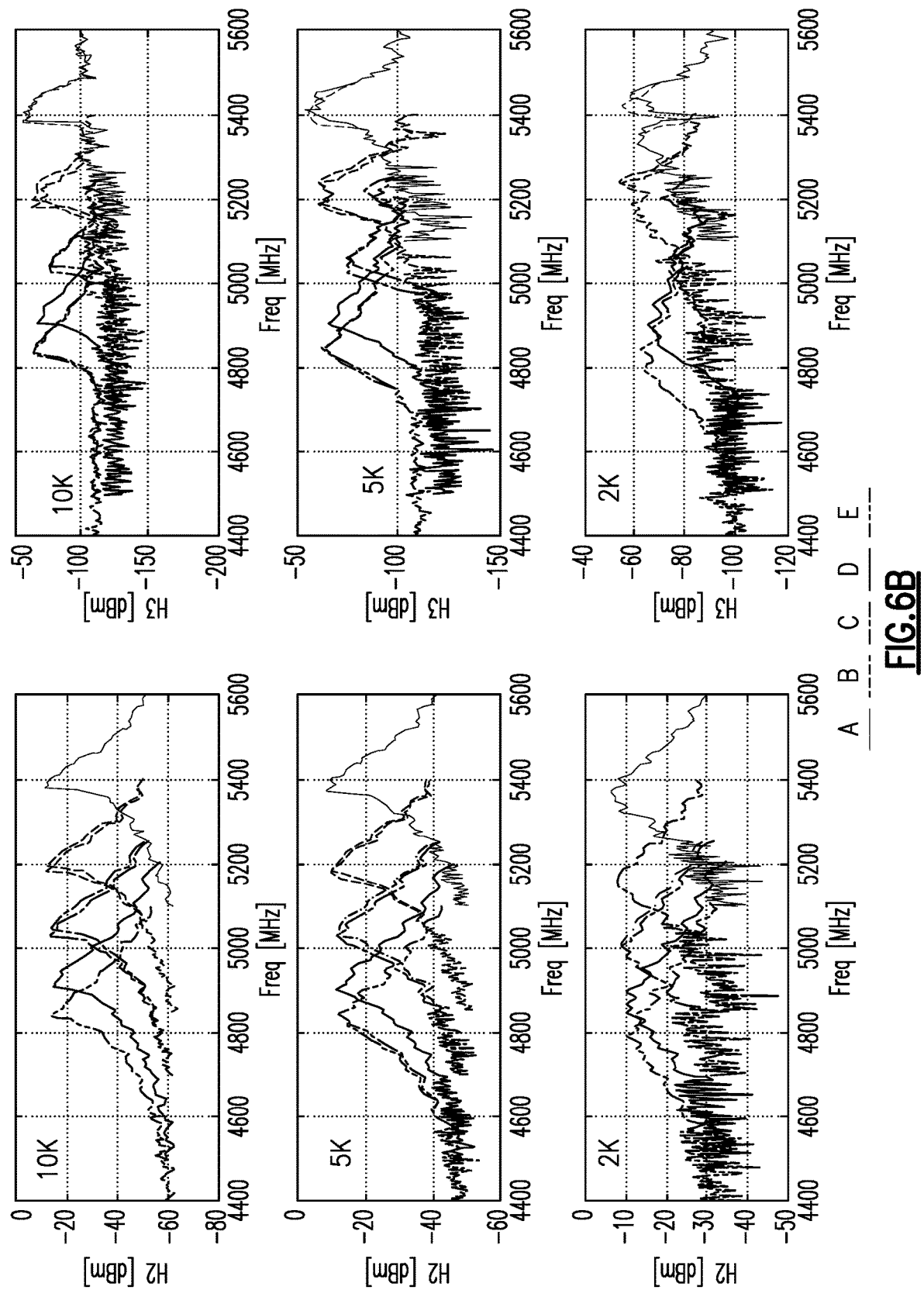
FIG. 6B illustrates the results of simulations of the H2 and H3 harmonics of FBARs having the membrane structures of a first set of examples in the table of FIG. 6A.

Results for the H2 and H3 simulations for the FBARs with the 300 µm thick piezoelectric material stacks, wafers A-E, are illustrated in FIG. 6B. From these results it can be seen that H2 increases (worsens) if the Sc doping drops too low, for example, for wafer A with 0% Sc doping. The lowest (best) peak H3 level was observed for wafer C with a 150 µm thick lower layer of undoped AlN and a 150 µm thick upper layer of Sc-doped AlN, a 50/50 thickness ratio of doped and undoped AlN layers.

Figure 6C:
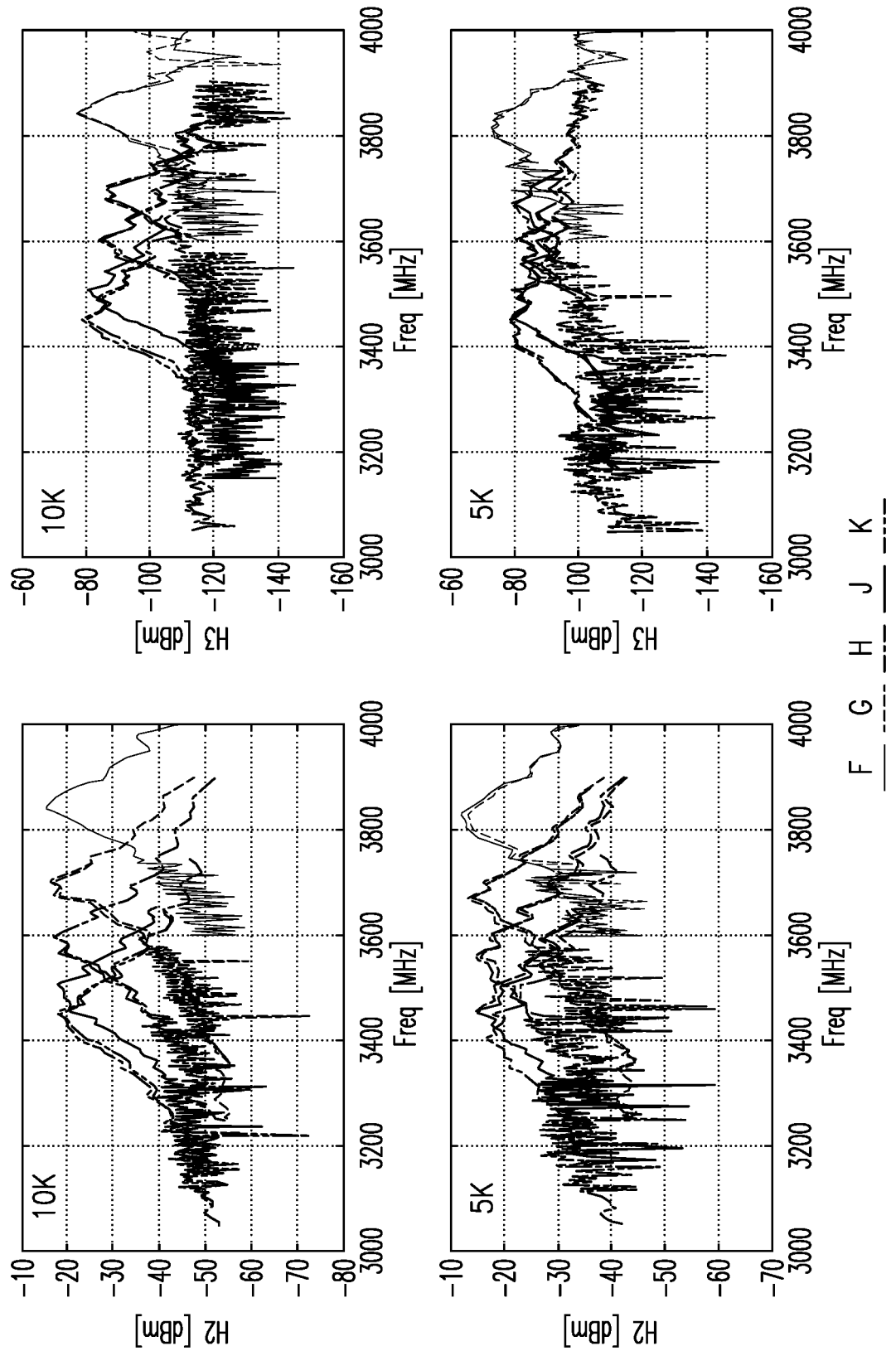
FIG. 6C illustrates the results of simulations of the H2 and H3 harmonics of FBARs having the membrane structures of a second set of examples in the table of FIG. 6A.

Results for the H2 and H3 simulations for the FBARs with the 600 µm thick piezoelectric material stacks, wafers F-K, are illustrated in FIG. 6C. As in the results for the 300 µm thick piezoelectric material stacks it can be seen that H2 increases (worsens) if the Sc doping drops too low, for example, for wafer F with 0% Sc doping. The lowest (best) peak H3 level was observed for wafer H with a 50/50 piezoelectric layer thickness ratio between Sc-doped and undoped AlN—a 300 µm thick lower layer of undoped AlN and a 300 µm thick upper layer of Sc-doped AlN.

Figure 6D:
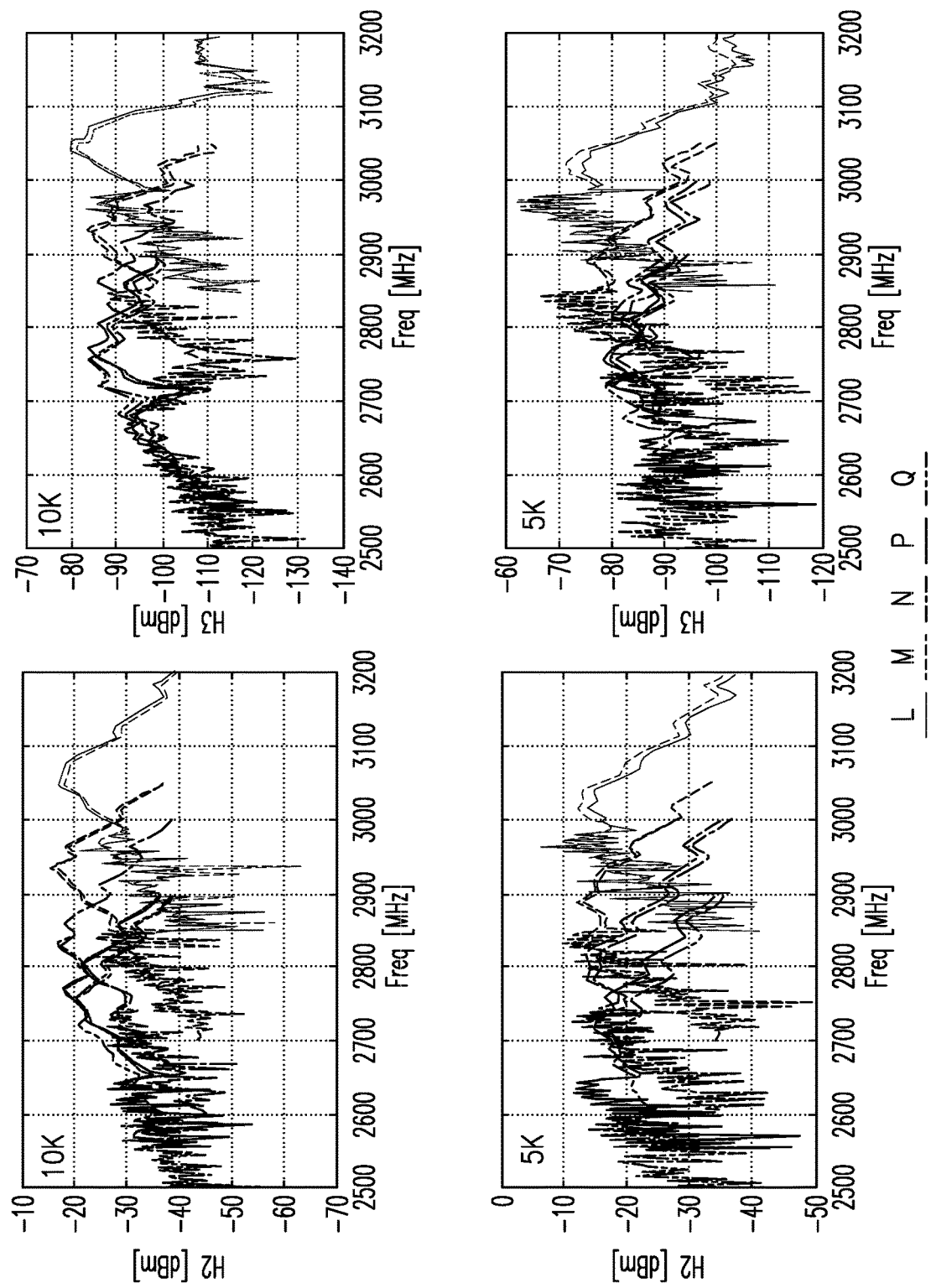
FIG. 6D illustrates the results of simulations of the H2 and H3 harmonics of FBARs having the membrane structures of a third set of examples in the table of FIG. 6A.

Results for the H2 and H3 simulations for the FBARs with the 900 µm thick piezoelectric material stacks, wafers L-Q, are illustrated in FIG. 6D. As in the results for the 300 µm thick piezoelectric material stacks and in the results for the 600 µm thick piezoelectric material stacks it can be seen that H2 increases (worsens) if the Sc doping drops too low, for example, for wafer L with 0% Sc doping. The lowest (best) peak H3 level was observed for wafer N with a 50/50 ratio of piezoelectric layer thickness between Sc-doped and undoped AlN—a 450 µm thick lower layer of undoped AlN and a 450 µm thick upper layer of Sc-doped AlN.

Simulations were performed to evaluate the effect on H2 and H3 suppression in an FBAR having a 600 µm thick piezoelectric film formed from two layers or from three layers with different thicknesses of Sc-doped AlN and undoped AlN layers. The thicknesses and arrangement of the different piezoelectric material layers for the simulated samples are shown in the table of FIG. 7A, with the wafer number identifying each sample. In the triple layer structures, wafers R-T, Sc-doped layers of different thicknesses were sandwiched between two undoped AlN layers with the same thicknesses, but with thicknesses different from the Sc-doped layer. The leftmost layer in table 7A was the bottommost layer in the piezoelectric material layer stack and the rightmost was the uppermost layer (the layer closest to the input) in the piezoelectric material layer stack. The dual layer piezoelectric material layer stacks of wafers G-J were considered asymmetric, while the triple layer piezoelectric material layer stacks of wafers R-T were considered to be symmetric.

Figure 7B:
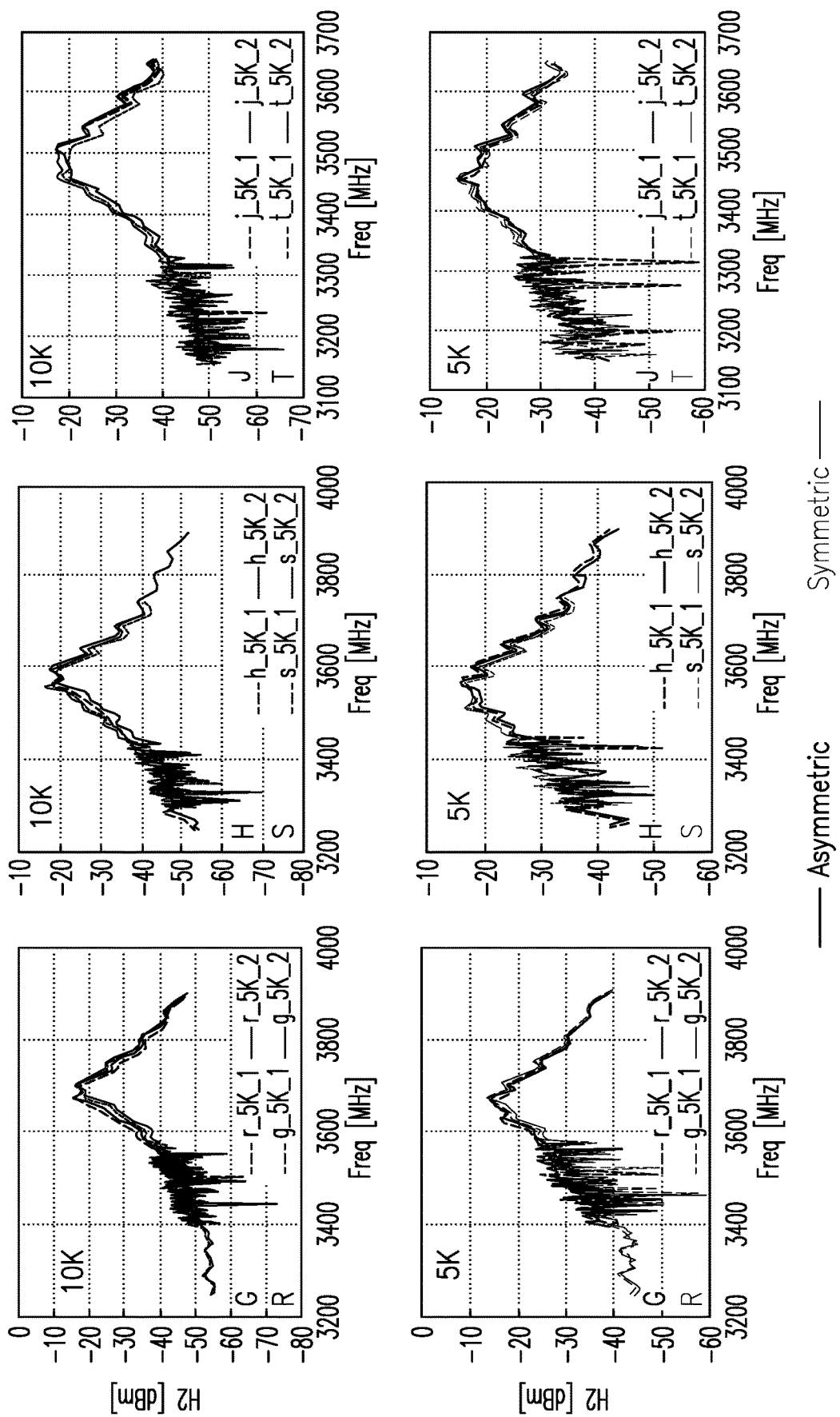
FIG. 7B illustrates the results of simulations of the H2 harmonics of FBARs having the membrane structures in the table of FIG. 7A.
Figure 7C:
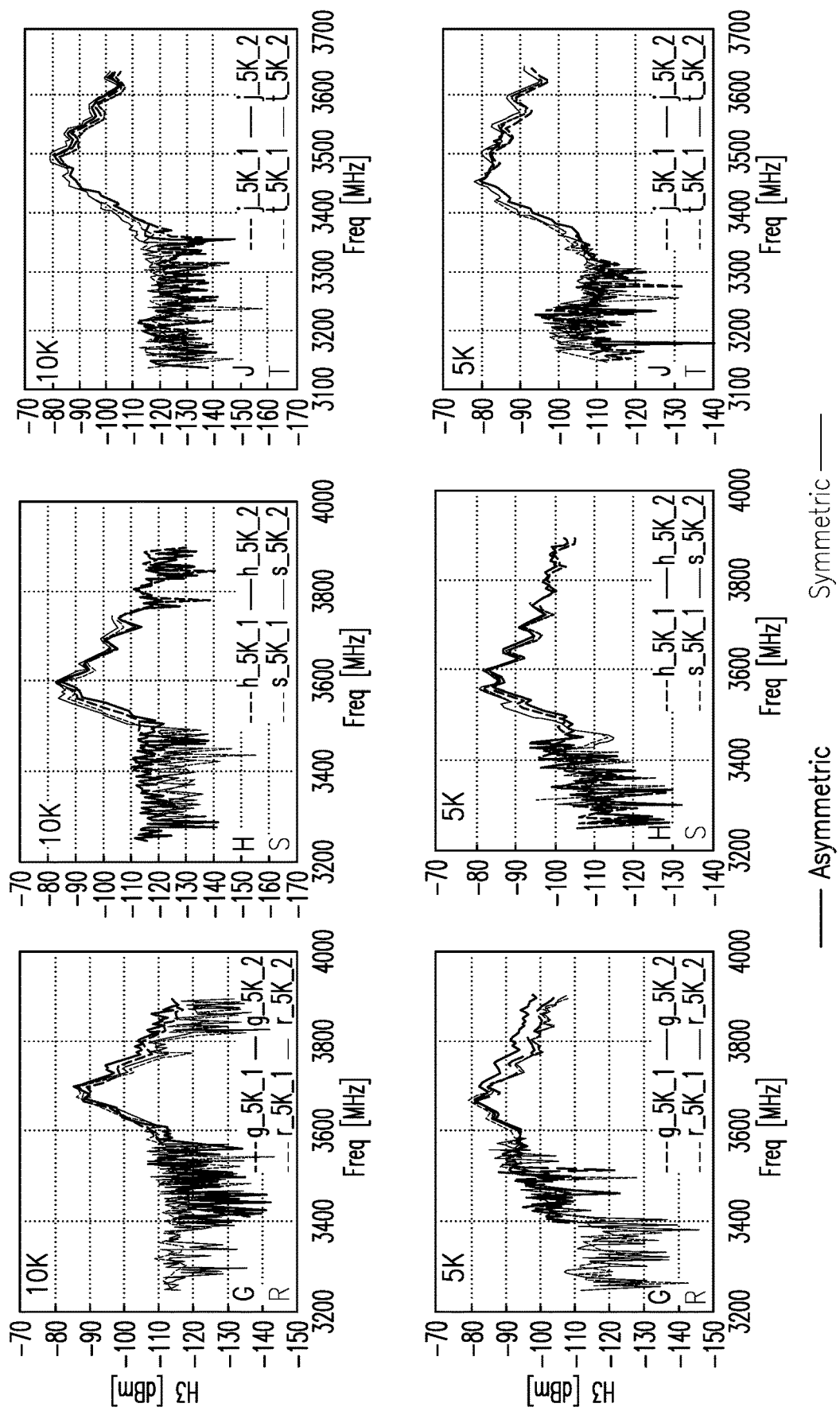
FIG. 7C illustrates the results of simulations of the H3 harmonics of FBARs having the membrane structures in the table of FIG. 7A.

The simulated H2 and H3 responses of FBARs having symmetric and asymmetric piezoelectric material layer stacks with the same total Sc doping were compared—the responses of FBARs with piezoelectric layers corresponding to wafers G vs. R, H vs. S, and J vs. T. The results of the simulations of H2 response of these sample pairs are illustrated in FIG. 7B. No significant difference in H2 response between the symmetric and asymmetric stack samples was observed. The results of the simulations of H3 response of these sample pairs are illustrated in FIG. 7C. A slight difference in H3 response between the symmetric and asymmetric stack samples was observed with the different samples exhibiting a better H3 response at some frequencies for the symmetric stack samples and a better H3 response at other frequencies for the asymmetric stack samples.

From the above simulations it can be observed that for an FBAR with a multi-layer piezoelectric film stack the best H2 suppression for the simulated samples can be observed when a mixture of layers with different Sc doping are utilized as compared to a piezoelectric film with either zero Sc doping or with uniform Sc doping throughout. H3 response of the simulated samples was minimized when the thicknesses of the Sc-doped and undoped AlN layers were the same. There is little difference in H2 or H3 response for symmetric vs. asymmetric piezoelectric film stacks.

Figure 8A:
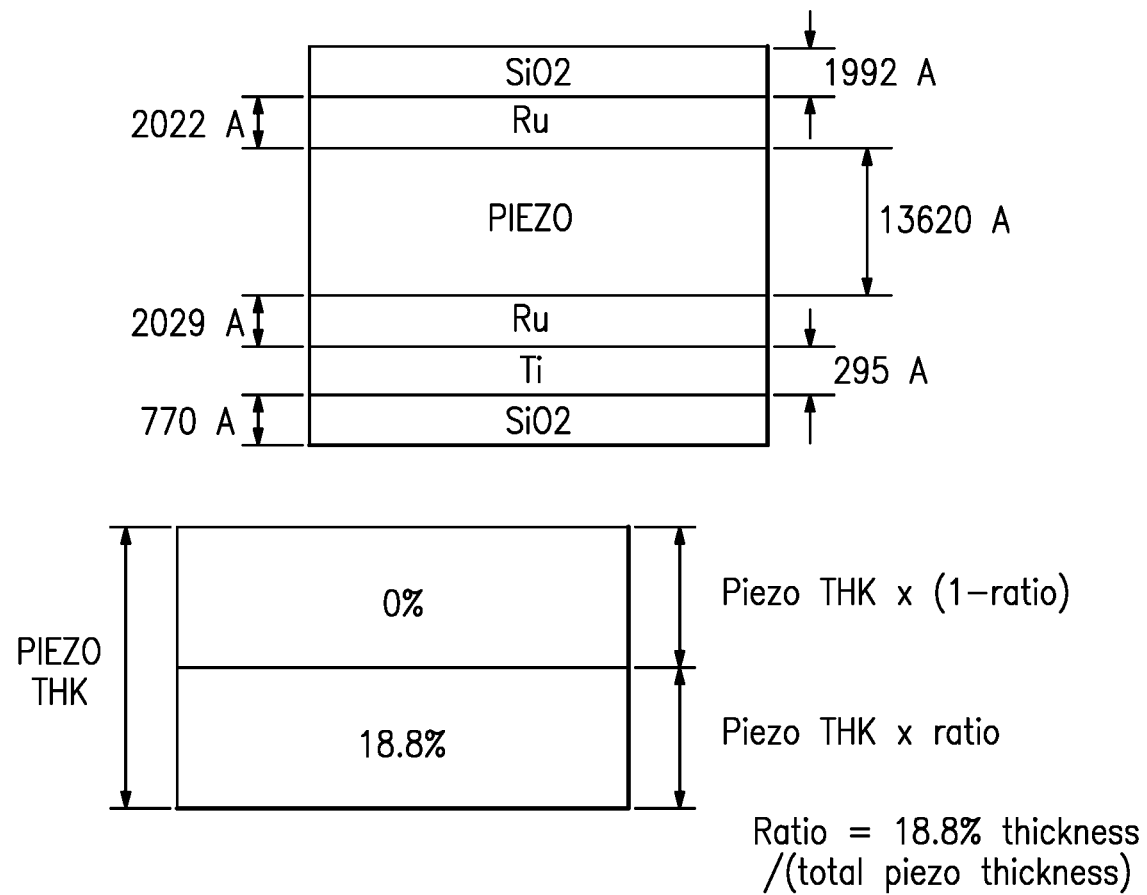
FIG. 8A illustrates the layers of a membrane of a simulated FBAR having a dual layer piezoelectric material film used to evaluate the effect on resonant frequency, antiresonant frequency, and electromagnetic coupling coefficient of different ratios of thickness of a doped and undoped layer in the dual layer piezoelectric material film.
Figure 8B:
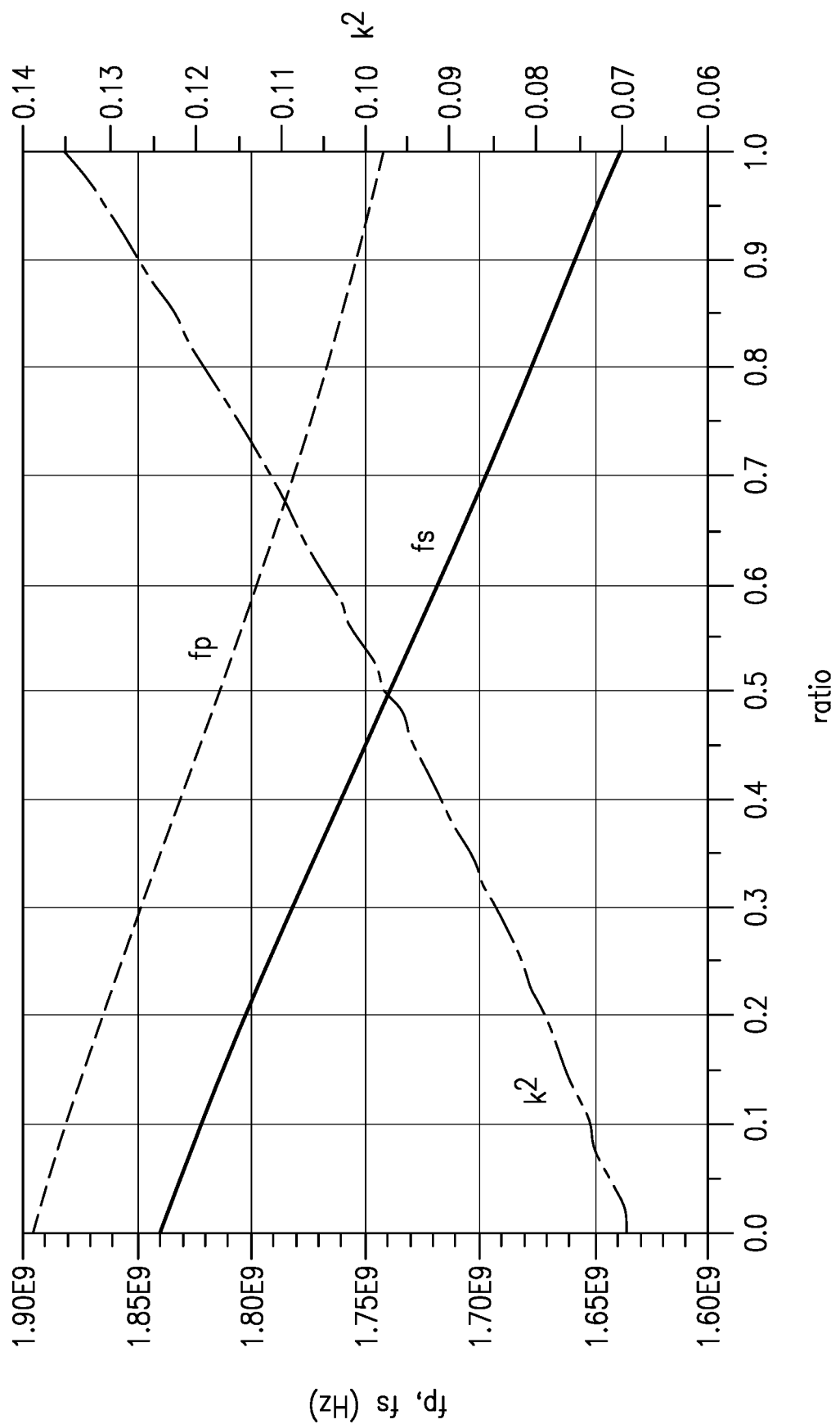
FIG. 8B illustrates results of the simulation of resonant frequency, antiresonant frequency, and electromagnetic coupling coefficient of the FBAR having the membrane structure illustrated in FIG. 8A.
Figure 8C:
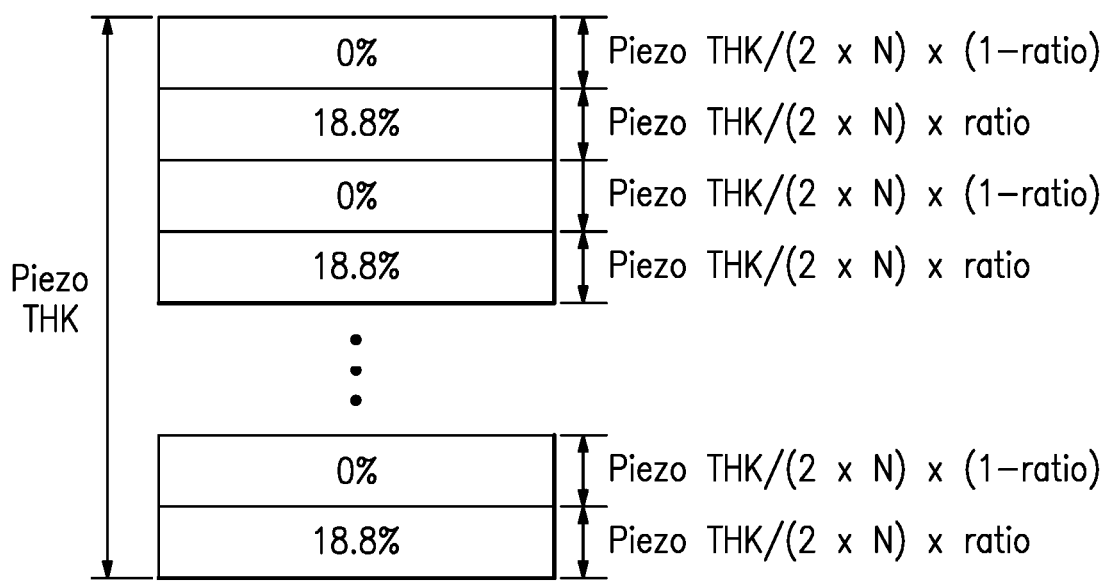
FIG. 8C illustrates the layers of a membrane of a simulated FBAR having a multiple layer piezoelectric material film used to evaluate the effect on resonant frequency and antiresonant frequency of different ratios of thickness of doped and undoped layers in the multiple layer piezoelectric material film.
Figure 8D:
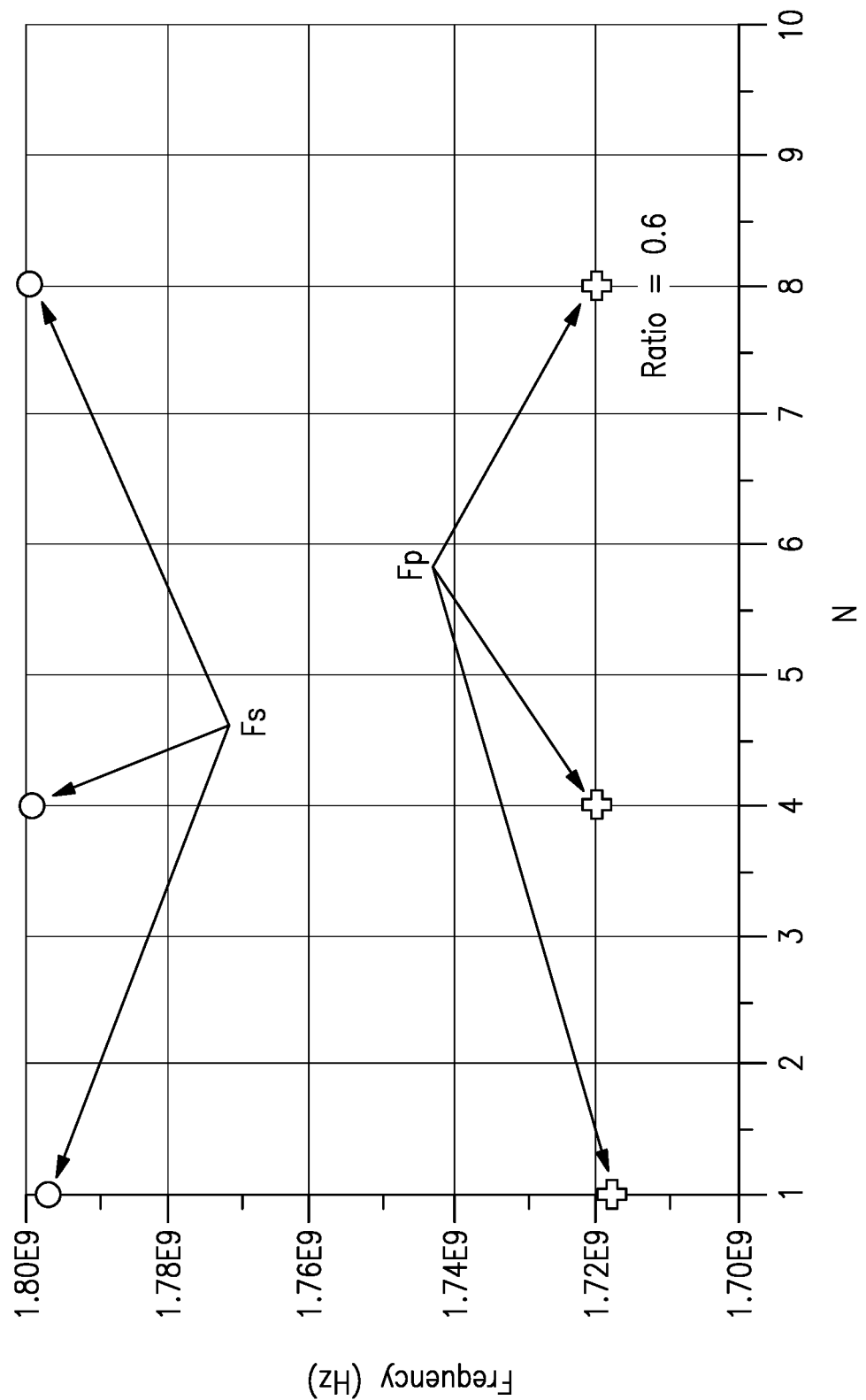
FIG. 8D illustrates results of a simulation of resonant frequency and antiresonant frequency as a function of number of layers in an FBAR having the piezoelectric film structure illustrated in FIG. 8C.

Further simulations were performed to evaluate the effect on resonant frequency $f_s$, antiresonant frequency $f_p$, and electromagnetic coupling coefficient $k^2$ of the relative thickness of Sc-doped vs. undoped AlN layers in a piezoelectric layer stack and on the total number of layers in the piezoelectric layer stack of an FBAR. The membrane of an FBAR with dielectric, electrode, and piezoelectric layers with thicknesses as illustrated in FIG. 8A was simulated for various ratios of 18.8 at % Sc-doped AlN layer thickness vs. undoped AlN layer thickness with the ratio x defined as also illustrated in FIG. 8A. The results, illustrated in FIG. 8B, show that $f_s$ and $f_p$ decrease approximately linearly with increased Sc-doped layer thickness while $k^2$ increases in an approximately quadratic manner with increased Sc-doped layer thickness. As the number of pairs of Sc-doped and undoped AlN layers N increases, in the manner illustrated in FIG. 8C, $f_s$ and $f_p$ remain unchanged, as illustrated in FIG. 8D. Accordingly, the ratio of the combined thickness of the Sc-doped layers to the combined thickness of the undoped AlN layers is determinative of the levels of $f_s$ and $f_p$, but not the total number of pairs of layers.

It should be appreciated that the BAWs and components thereof illustrated in the figures presented herein are illustrated in a highly simplified form. The relative dimensions of the different features are not shown to scale. Further, typical BAWs may include additional features or layers not illustrated.

Figure 9:
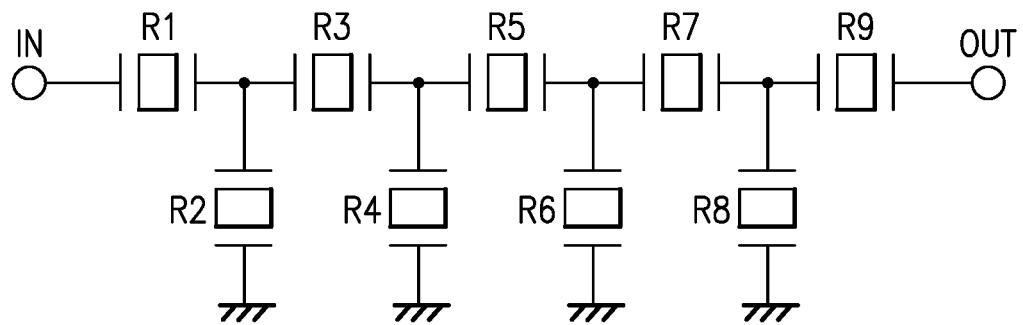
FIG. 9 is a schematic diagram of a radio frequency ladder filter.

In some embodiments, multiple BAWs as disclosed herein may be combined into a filter, for example, an RF ladder filter schematically illustrated in FIG. 9 and including a plurality of series resonators R1, R3, R5, R7, and R9, and a plurality of parallel (or shunt) resonators R2, R4, R6, and R8. As shown, the plurality of series resonators R1, R3, R5, R7, and R9 are connected in series between the input and the output of the RF ladder filter, and the plurality of parallel resonators R2, R4, R6, and R8 are respectively connected between series resonators and ground in a shunt configuration. Other filter structures and other circuit structures known in the art that may include BAW devices or resonators, for example, duplexers, baluns, etc., may also be formed including examples of BAW resonators as disclosed herein.

Figure 10:
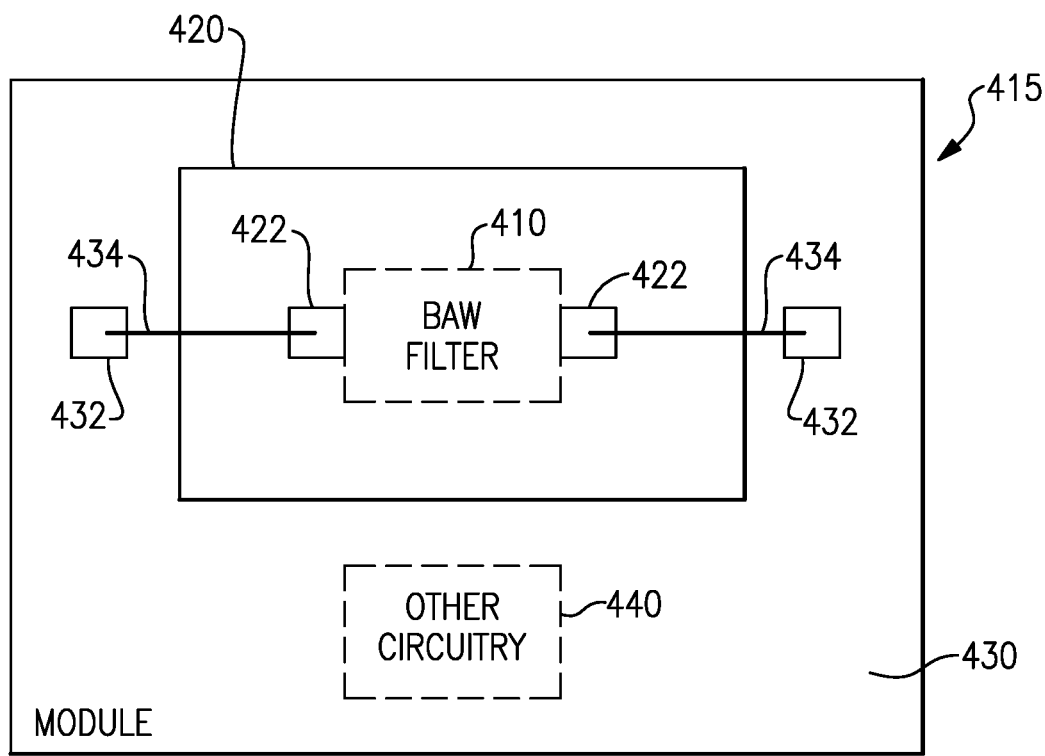
FIG. 10 is a block diagram of one example of a filter module that can include one or more bulk acoustic wave elements according to aspects of the present disclosure.
Figure 11:
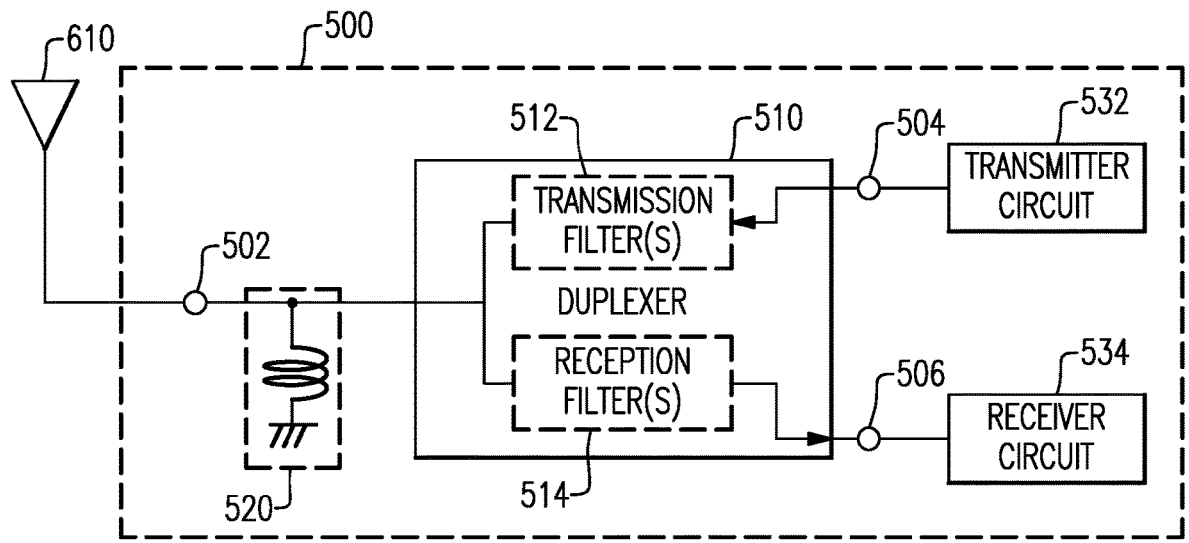
FIG. 11 is a block diagram of one example of a front-end module that can include one or more filter modules according to aspects of the present disclosure.
Figure 12:
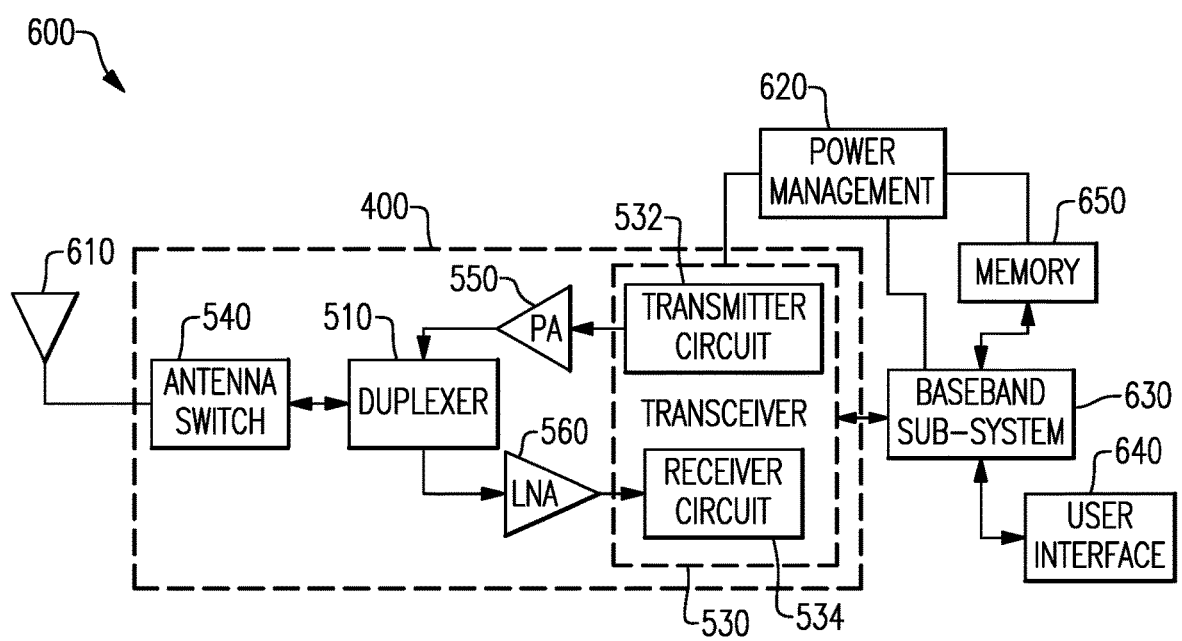
FIG. 12 is a block diagram of one example of a wireless device including the front-end module of FIG. 11.

The acoustic wave devices discussed herein can be implemented in a variety of packaged modules. Some example packaged modules will now be discussed in which any suitable principles and advantages of the packaged acoustic wave devices discussed herein can be implemented. FIGS. 10, 11, and 12 are schematic block diagrams of illustrative packaged modules and devices according to certain embodiments.

As discussed above, embodiments of the disclosed BAWs can be configured as or used in filters, for example. In turn, a BAW filter using one or more BAW elements may be incorporated into and packaged as a module that may ultimately be used in an electronic device, such as a wireless communications device, for example. FIG. 10 is a block diagram illustrating one example of a module 400 including a BAW filter 410. The BAW filter 410 may be implemented on one or more die(s) 420 including one or more connection pads 422. For example, the BAW filter 410 may include a connection pad 422 that corresponds to an input contact for the BAW filter and another connection pad 422 that corresponds to an output contact for the BAW filter. The packaged module 400 includes a packaging substrate 430 that is configured to receive a plurality of components, including the die 420. A plurality of connection pads 432 can be disposed on the packaging substrate 430, and the various connection pads 422 of the BAW filter die 420 can be connected to the connection pads 432 on the packaging substrate 430 via electrical connectors 434, which can be solder bumps or wirebonds, for example, to allow for passing of various signals to and from the BAW filter 410. The module 400 may optionally further include other circuitry die 440, such as, for example, one or more additional filter(s), amplifiers, pre-filters, modulators, demodulators, down converters, and the like, as would be known to one of skill in the art of semiconductor fabrication in view of the disclosure herein. In some embodiments, the module 400 can also include one or more packaging structures to, for example, provide protection and facilitate easier handling of the module 400. Such a packaging structure can include an overmold formed over the packaging substrate 430 and dimensioned to substantially encapsulate the various circuits and components thereon.

Various examples and embodiments of the BAW filter 410 can be used in a wide variety of electronic devices. For example, the BAW filter 410 can be used in an antenna duplexer, which itself can be incorporated into a variety of electronic devices, such as RF front-end modules and communication devices.

Referring to FIG. 11, there is illustrated a block diagram of one example of a front-end module 500, which may be used in an electronic device such as a wireless communications device (e.g., a mobile phone) for example. The front-end module 500 includes an antenna duplexer 510 having a common node 502, an input node 504, and an output node 506. An antenna 610 is connected to the common node 502.

The antenna duplexer 510 may include one or more transmission filters 512 connected between the input node 504 and the common node 502, and one or more reception filters 514 connected between the common node 502 and the output node 506. The passband(s) of the transmission filter(s) are different from the passband(s) of the reception filter(s). Examples of the BAW filter 410 can be used to form the transmission filter(s) 512 and/or the reception filter(s) 514. An inductor or other matching component 520 may be connected at the common node 502.

The front-end module 500 further includes a transmitter circuit 532 connected to the input node 504 of the duplexer 510 and a receiver circuit 534 connected to the output node 506 of the duplexer 510. The transmitter circuit 532 can generate signals for transmission via the antenna 610, and the receiver circuit 534 can receive and process signals received via the antenna 610. In some embodiments, the receiver and transmitter circuits are implemented as separate components, as shown in FIG. 11, however in other embodiments these components may be integrated into a common transceiver circuit or module. As will be appreciated by those skilled in the art, the front-end module 500 may include other components that are not illustrated in FIG. 11 including, but not limited to, switches, electromagnetic couplers, amplifiers, processors, and the like.

FIG. 12 is a block diagram of one example of a wireless device 600 including the antenna duplexer 510 shown in FIG. 11. The wireless device 600 can be a cellular phone, smart phone, tablet, modem, communication network or any other portable or non-portable device configured for voice or data communication. The wireless device 600 can receive and transmit signals from the antenna 610. The wireless device includes an embodiment of a front-end module 500 similar to that discussed above with reference to FIG. 11. The front-end module 500 includes the duplexer 510, as discussed above. In the example shown in FIG. 12 the front-end module 500 further includes an antenna switch 540, which can be configured to switch between different frequency bands or modes, such as transmit and receive modes, for example. In the example illustrated in FIG. 12, the antenna switch 540 is positioned between the duplexer 510 and the antenna 610; however, in other examples the duplexer 510 can be positioned between the antenna switch 540 and the antenna 610. In other examples the antenna switch 540 and the duplexer 510 can be integrated into a single component.

The front-end module 500 includes a transceiver 530 that is configured to generate signals for transmission or to process received signals. The transceiver 530 can include the transmitter circuit 532, which can be connected to the input node 504 of the duplexer 510, and the receiver circuit 534, which can be connected to the output node 506 of the duplexer 510, as shown in the example of FIG. 11.

Signals generated for transmission by the transmitter circuit 532 are received by a power amplifier (PA) module 550, which amplifies the generated signals from the transceiver 530. The power amplifier module 550 can include one or more power amplifiers. The power amplifier module 550 can be used to amplify a wide variety of RF or other frequency-band transmission signals. For example, the power amplifier module 550 can receive an enable signal that can be used to pulse the output of the power amplifier to aid in transmitting a wireless local area network (WLAN) signal or any other suitable pulsed signal. The power amplifier module 550 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 550 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 12, the front-end module 500 may further include a low noise amplifier module 560, which amplifies received signals from the antenna 610 and provides the amplified signals to the receiver circuit 534 of the transceiver 530.

The wireless device 600 of FIG. 12 further includes a power management sub-system 620 that is connected to the transceiver 530 and manages the power for the operation of the wireless device 600. The power management system 620 can also control the operation of a baseband sub-system 630 and various other components of the wireless device 600. The power management system 620 can include, or can be connected to, a battery (not shown) that supplies power for the various components of the wireless device 600. The power management system 620 can further include one or more processors or controllers that can control the transmission of signals, for example. In one embodiment, the baseband sub-system 630 is connected to a user interface 640 to facilitate various input and output of voice and/or data provided to and received from the user. The baseband sub-system 630 can also be connected to memory 650 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A bulk acoustic wave resonator comprising a membrane including a piezoelectric film having an odd number of more than two layers of piezoelectric material, a centermost of the more than two layers of piezoelectric material having a higher doping level than others of the more than two layers of piezoelectric material.

2. The bulk acoustic wave resonator of claim 1 wherein the odd number of more than two layers of piezoelectric material are arranged asymmetrically with respect to a thickness thereof, and wherein an upper layer of the odd number of more than two layers of piezoelectric material has a different thickness than a thickness of a lower layer of the odd number of more than two layers of piezoelectric material.

3. The bulk acoustic wave resonator of claim 1 wherein the odd number of more than two layers of piezoelectric material are arranged asymmetrically with respect to one of doping concentration or thickness in a direction from an input side to an output side of the piezoelectric film.

4. The bulk acoustic wave resonator of claim 1 wherein the centermost layer of the odd number of more than two layers of piezoelectric material is formed of AlN doped with Sc and the other layers of the odd number of more than two layers of piezoelectric material are formed of undoped AlN.

5. The bulk acoustic wave resonator of claim 1 configured as a film bulk acoustic wave resonator.

6. The bulk acoustic wave resonator of claim 1 configured as a solidly mounted resonator.

7. The bulk acoustic wave resonator of claim 1 included in a radio frequency filter.

8. The bulk acoustic wave resonator of claim 7 included in an electronic device module.

9. The bulk acoustic wave resonator of claim 8 included in an electronic device.

10. The bulk acoustic wave resonator of claim 1 wherein the centermost layer of the odd number of more than two layers of piezoelectric material has a greater thickness than thicknesses of the others of the odd number of more than two layers of piezoelectric material.

11. The bulk acoustic wave resonator of claim 10 wherein the odd number of more than two layers of piezoelectric material are configured symmetrically with respect to doping concentration and thickness in a direction from an input side to an output side of the piezoelectric film.

12. The bulk acoustic wave resonator of claim 10 wherein the centermost layer of the odd number of more than two layers of piezoelectric material has a thickness approximately equal to a sum of thicknesses of the other layers of the odd number of more than two layers of piezoelectric material.

13. A method of forming a bulk acoustic wave resonator comprising forming a membrane for the bulk acoustic wave resonator by forming an odd number of more than two layers of piezoelectric material, a centermost layer of the more than two layers of piezoelectric material having a higher doping level than other layers of the more than two layers of piezoelectric material.

* * * * *